(12) United States Patent
Sonobe et al.

(10) Patent No.: US 7,436,066 B2
(45) Date of Patent: Oct. 14, 2008

(54) SEMICONDUCTOR ELEMENT

(75) Inventors: Shinya Sonobe, Anan (JP); Masakatsu Tomonari, Anan (JP); Yoshiki Inoue, Anan (JP)

(73) Assignee: Nichia Corporation, Tokushima (JP)

( * ) Notice: Subject to any disclaimer, the term of this patent is extended or adjusted under 35 U.S.C. 154(b) by 48 days.

(21) Appl. No.: 10/563,100

(22) PCT Filed: Oct. 6, 2005

(86) PCT No.: PCT/JP2005/018510

§ 371 (c)(1),
(2), (4) Date: Dec. 30, 2005

(87) PCT Pub. No.: WO2006/043422

PCT Pub. Date: Apr. 27, 2006

(65) Prior Publication Data

US 2007/0023777 A1  Feb. 1, 2007

(30) Foreign Application Priority Data

Oct. 19, 2004  (JP)  ............................ 2004-304763

(51) Int. Cl.
*H01L 29/45* (2006.01)
*H01L 21/441* (2006.01)

(52) U.S. Cl. ............... 257/767; 257/762; 257/E33.063; 438/650; 438/686

(58) Field of Classification Search ................. 257/103, 257/762, E33.063, 767, E33.062, E29.143; 438/650, 686, 927
See application file for complete search history.

(56) References Cited

U.S. PATENT DOCUMENTS 6,194,743 B1    2/2001  Kondoh et al.
(Continued)

FOREIGN PATENT DOCUMENTS

JP    5-54465 A    3/1993
(Continued)

OTHER PUBLICATIONS

Kim, Jong Kyu et al., Microstructural study of Pt contact on p-type GaN, Journal of Vauum Science and Technology B, vol. 21, Issue 1, pp. 87-90, Jan. 2003.*

*Primary Examiner*—David Vu
*Assistant Examiner*—Earl N Taylor
(74) *Attorney, Agent, or Firm*—Birch, Stewart, Kolasch & Birch, LLP

(57) ABSTRACT

It is an object of the present invention to provide a highly reliable and high-quality semiconductor element by effectively preventing the migration of silver to a nitride semiconductor when an electrode main entirely or mostly of silver having high reflection efficiency is formed in contact with a nitride semiconductor layer. A semiconductor element comprises a nitride semiconductor layer, an electrode connected to said nitride semiconductor layer, and an insulating film covering at least part of said electrode, wherein the electrode comprises: a first metal film including silver or a silver alloy and in contact with the nitride semiconductor layer; and a second metal film completely covering the first metal film, and the insulating film comprises a nitride film.

24 Claims, 10 Drawing Sheets

U.S. PATENT DOCUMENTS

| | | |
|---|---|---|
| 2001/0015442 A1 | 8/2001 | Kondoh et al. |
| 2002/0136932 A1 | 9/2002 | Yoshida |
| 2003/0052328 A1* | 3/2003 | Uemura ..................... 257/103 |
| 2004/0222434 A1 | 11/2004 | Uemura et al. |
| 2005/0179051 A1 | 8/2005 | Kondoh et al. |

FOREIGN PATENT DOCUMENTS

| | | |
|---|---|---|
| JP | 8-298341 A | 11/1996 |
| JP | 10-69756 A | 3/1998 |
| JP | 10-93905 A | 4/1998 |
| JP | 11-87771 A | 3/1999 |
| JP | 11-161663 A | 6/1999 |
| JP | 11-191641 A | 7/1999 |
| JP | 11-220171 A | 8/1999 |
| JP | 2001-217461 A | 8/2001 |
| JP | 2002-140882 A | 5/2002 |
| JP | 2003-17741 A | 1/2003 |
| JP | 2003-189197 A | 7/2003 |
| JP | 2003-243705 A | 8/2003 |
| JP | 2004-71655 A | 3/2004 |

* cited by examiner

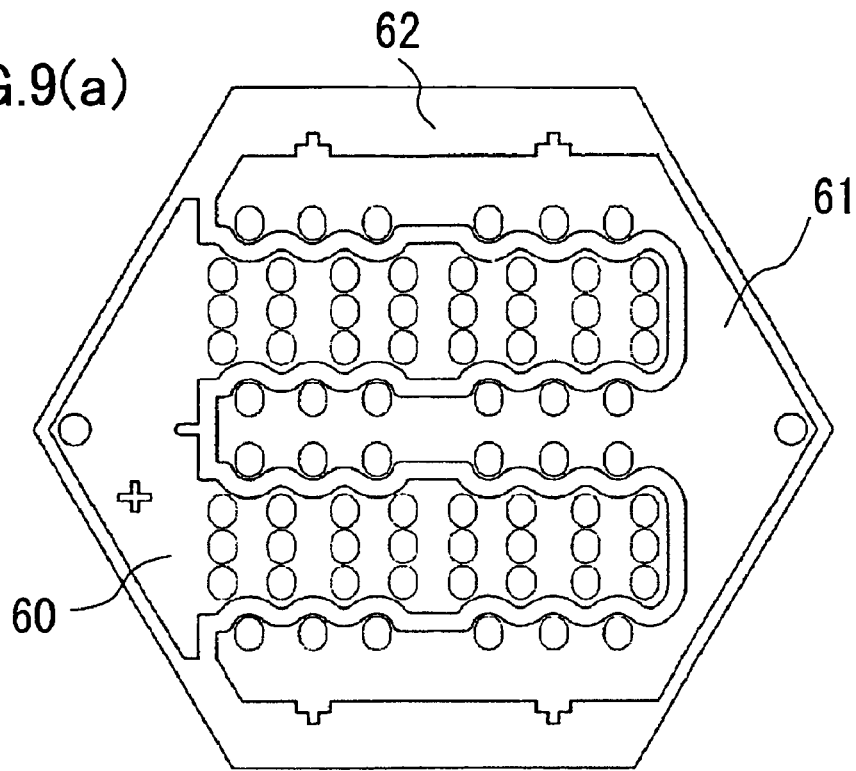
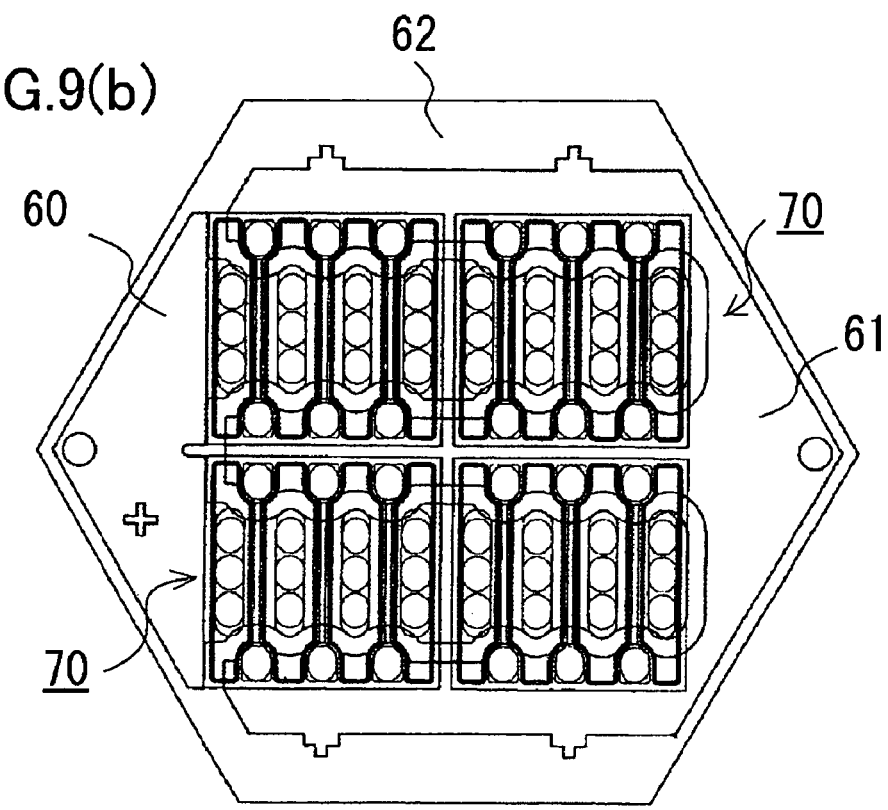

SEMICONDUCTOR ELEMENT

TECHNICAL FIELD

The present invention relates to a semiconductor element comprised of a nitride semiconductor, and more particularly relates to an improved electrode in a semiconductor element.

BACKGROUND ART

In the past, the p-type electrodes in flip-chip nitride semiconductor light emitting elements have been used a structure comprised of silver or a silver alloy. Because silver very efficiently reflects the light produced by the light emitting layer of a light emitting element, such an element is able to emit light of high brightness.

When silver is used for the electrode material on the p side, however, part of the silver electrode surface has to be exposed for the purpose of connection with external components and so forth, and this causes and promotes the migration of silver ions, which changes the silver at the interface with the nitride semiconductor layer, and can lead to problems such as decreased light emission intensity due to the light produced by the light emitting layer not being reflected as efficiently by the electrode, and decreased service life due to the movement of silver to the other electrode, which causes short-circuiting.

One measure that has been taken to deal with this problem is to completely cover the silver electrode with an-electrode material that does not contain silver, and form a protective film over this, in order to prevent the silver electrode surface from being exposed. However, if a heat treatment is performed after electrode formation, or depending on the conditions of this heat treatment and so forth, it is sometimes impossible to adequately suppress the diffusion of the silver into the electrode material that contains no silver, which means that the migration of silver cannot be prevented.

In response to this problem, a method has been proposed for preventing the migration of silver by disposing an $SiO_2$ film having a plurality of through holes between the silver electrode and the electrode material containing no silver, and electrically connecting the silver electrode and the electrode material containing no silver through this holes (see Patent Document 1, for example).

Other proposals include an LED in which a metal layer is formed over a silver layer on a p-type nitride semiconductor layer, and a dielectric layer is formed on part of the surface of the silver layer (see Patent Document 2, for example), a semiconductor light emitting element in which a p-type electrode is formed from a laminate of a contact layer and a reflecting layer made of a silvery white metal disposed over this contact layer (see Patent Document 3, for example), a semiconductor element having an-electrode formed from a first metal layer connected to a contact layer on the p-type semiconductor side, and a second metal layer that covers at least the side face of the first metal layer and the surface of the contact layer not covered by the first metal layer, in which the first metal layer is formed from silver (Ag), and the second metal layer from vanadium (V) and aluminum (Al) or titanium (Ti) and gold (Au) (see Patent Document 4, for example), a light emitting element equipped with a first thin-film metal layer comprised of cobalt (Co), nickel (Ni), or an alloy of these between a p-type nitride semiconductor layer and a positive electrode (see Patent Document 5, for example), and so forth.

Patent Document 1: JP-2003-168823-A
Patent Document 2: JP-H11-186599-A
Patent Document 3: JP-H11-191641-A
Patent Document 4: JP-H11-220171-A
Patent Document 5: JP-2000-36619-A With Patent Document 1, however, because an $SiO_2$ film is disposed between a silver electrode and an electrode material containing no silver, even though electrical connection is ensured by the through-holes, a problem is increased contact resistance between the two electrodes.

Also, although the migration of silver to the electrode material containing no silver is suppressed by physically blocking off the electrode with the $SiO_2$ film, this does not effectively prevent the migration of silver to the nitride semiconductor layer, so this still does not mitigate the decrease in the service life of the light emitting element or the decrease in light emission intensity attributable to the migration of silver.

Furthermore, the suppression of silver migration cannot be considered satisfactory in any of these publications, and there is a need for a light emitting element that better prevents this migration, which in turn affords better semiconductor element reliability and higher yield, as well as a semiconductor element with more efficient light take-off.

DISCLOSURE OF THE INVENTION

The present invention was conceived in light of the above problems, and it is an object thereof to provide a highly reliable and high-quality semiconductor element by effectively preventing the migration of silver to a nitride semiconductor when an electrode main entirely or mostly of silver having high reflection efficiency is formed in contact with a nitride semiconductor layer.

In other words, the migration of silver in an electrode comprised of silver or a silver alloy is not only caused by contact with other electrode materials or semiconductors, or heat treatment in a contact state, or the flow of current in a contact state, for example, but also tends to be caused by the action of tiny amounts of water (moisture) on the silver, so it is an object of the present invention to provide a high-quality semiconductor element with which an electrode comprised of silver or a silver alloy is isolated from moisture, thereby effectively preventing the migration of silver.

As a result of diligent research into the migration of silver in an electrode comprised of silver or a silver alloy, the inventors arrived at the present invention upon discovering that the migration of silver can be dramatically reduced by configuring a semiconductor element as follows.

The present invention is characterized in that a semiconductor element, comprising a nitride semiconductor layer, an electrode connected to said nitride semiconductor layer, and an insulating film covering at least part of said electrode, wherein the electrode comprises:

a first metal film including silver or a silver alloy and in contact with the nitride semiconductor layer; and a second metal film completely covering the first metal film or a second metal film formed so as to prevent the silver from moving across the surface of the nitride semiconductor layer, and the insulating film comprises a nitride film.

With the semiconductor element of the present invention, a first metal film comprised of silver or a silver alloy is completely covered by a second metal film, and therefore not exposed, so the first metal film comprised of silver or a silver alloy can be prevented from coming into contact with moisture. Even if the silver moves across the nitride semiconductor layer surface, this movement can be halted by the second metal film, and in addition, the movement of silver in a direction perpendicular to the interface between the nitride semiconductor and the electrode can be prevented by the second metal film or the insulating film. Furthermore, it is believed that because this insulating film that covers the first and second metal films is formed from a nitride, any moisture that would act on the electrode is effectively trapped by the nitrogen atoms in the insulating film disposed near the electrode of the semiconductor element. As a result, even if the electrode containing the first metal film comprised of silver or a silver alloy is subjected to a heat treatment or the flow of current, the migration of silver can still be effectively prevented, which increases the light emission intensity and extends the service life, and allows a high-quality semiconductor element of high reliability to be obtained.

Saying that "a second metal film is formed so as to prevent the silver from moving across the surface of the nitride semiconductor layer" means that the second metal film touches the first metal film at least at the surface of the nitride semiconductor layer, so that the second metal film covers all the way around the first metal film, and preferably that the surface of the first metal film away from the nitride semiconductor layer is covered by the second metal film. If the second metal film is formed so as to cover all the way around the first metal film at the surface of the nitride semiconductor layer, this will prevent the most likely cause of silver migration, that is, the phenomenon whereby silver moves across the nitride semiconductor layer surface toward the other electrode. In addition, if the surface of the first metal film away from the nitride semiconductor layer is covered, it will be possible to completely prevent the movement of silver, which is prone to migration.

BRIEF DESCRIPTION OF THE DRAWINGS

FIG. 9a is a top view of a support substrate for mounting the semiconductor element of the present invention, and FIG. 9b is a top view of a mounted light emitting element;

Figure 1:
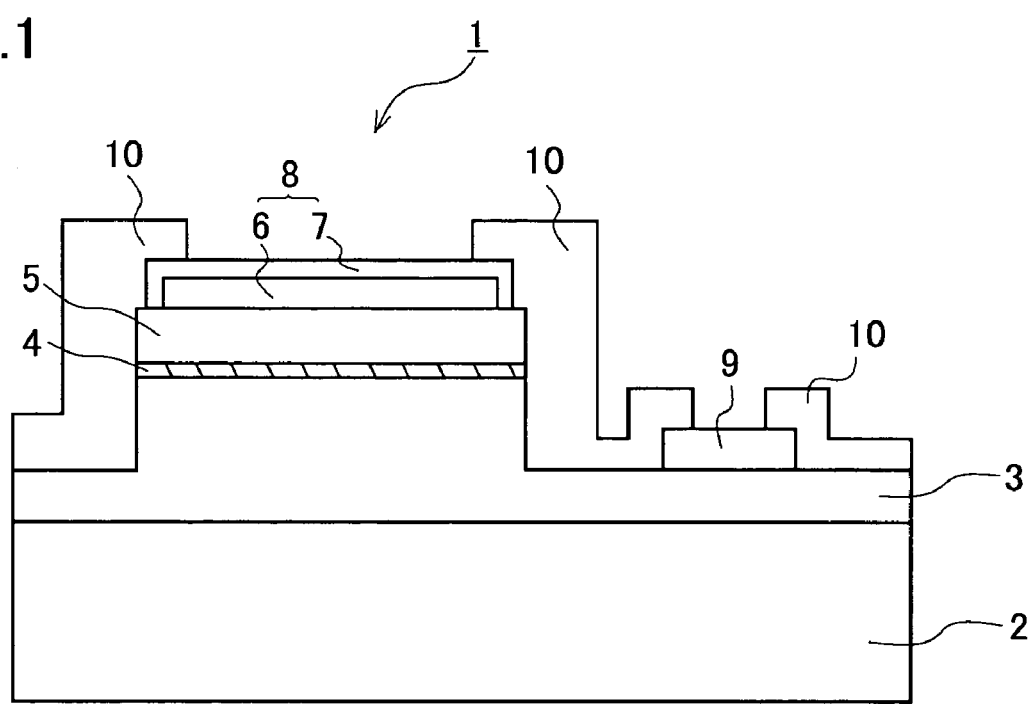
FIG. 1 is a cross section of an embodiment of the semiconductor element of the present invention.

DESCRIPTION OF THE REFERENCE MARK 1, 30, 70 semiconductor element
2, 11 sapphire substrate
3 n-type semiconductor layer
4 light emitting layer
5 p-type semiconductor layer
6, 65, 66, 67 first metal film
7, 21, 34 second metal film
8 p-electrode (electrode)
9, 19, 35 n-electrode
10 insulating film
12 buffer layer
13 non-dope GaN layer
14 n-type contact layer
15 n-type clad layer
16 active layer
17 p-type clad layer
18 p-type contact layer
20 convex portions
22 silver film
31 end portion
32 constricted portion
33 extended portion
36, 37 pad electrode
38 p pad electrode
39, 39a, 39b resin layer
40, 41, 50, 51, 53a to 53c, 60, 61 conductive wiring
42 support substrate
43, 45, 46 light emitting device
44 bump electrode
47 wavelength conversion member
65a, 66a, 67a silver film
65b, 65d, 66b, 67b nickel film
65c, 66c, 67c platinum film
66b laminated film of titanium/nickel
120 stem
120a recess
121 first lead
122 second lead
131, 141 sealing member
150 fluorescent material
160 sub-mount member
161, 162 electrode
200 LED chip
201 mounting substrate
202 recess
203 lead
204 adhesive layer
205 sub-mount substrate
206 reflection component
207 terrace
208 light take-off component
209 translucent sealing member
212 package

BEST MODE FOR CARRYING OUT THE INVENTION

As discussed above, the semiconductor element of the present invention comprises an electrode formed on a nitride semiconductor layer, and an insulating film that covers this electrode.

The electrode formed over the nitride semiconductor layer is directly connected to the nitride semiconductor layer and preferably ohmically connected. "Ohmically connected" is used here in the sense in which it is normally used in this field, and refers, for example, to a junction in which the current-voltage characteristics are linear or substantially linear. This also means that the voltage drop and power loss at the junction during device operation are low enough to be ignored.

This electrode is made up of at least a first metal film including silver or a silver alloy, and a second metal film.

The first metal film may be a single-layer film of silver, or a single-layer film of a silver alloy, or a multilayer film in which silver or a silver alloy is disposed as the lowermost layer. In the case of a multilayer film, the films other than the lowermost layer may be formed from silver or a silver alloy, or from an electrode material not containing silver or a silver alloy. The first metal film may also be made up of a film comprised of silver or a silver alloy, and a nickel film disposed in part of the area between said silver film and the nitride semiconductor layer.

There may also be a gradient in the composition of the first metal film, from the nitride semiconductor layer side toward the second metal film side. For instance, on the nitride semiconductor layer side it may be a silver film or a film of an alloy containing silver and about 1% of an element other than silver, and on the second metal film side it may be a film of an alloy containing silver and about 5% of an element other than silver. If the proportion of the element other than silver versus silver increases moving away from the nitride semiconductor layer, it will be possible to obtain high light reflection characteristics and at the same time suppress reaction with silver on the second metal film side.

Examples of silver alloys include alloys of silver and one or more electrode materials selected from the group consisting of Pt, Co, Au, Pd, Ti, Mn, V, Cr, Zr, Rh, Cu, Al, Mg, Bi, Sn, Ir, Ga, Nd, and Re. Nickel does not readily form an alloy with silver, that is, its reaction with silver tends to be suppressed, so the silver film may also include elemental nickel.

Examples of the films other than the lowermost layer include single-layer films of one or more metals or alloys selected from the group including these electrode materials and nickel, and multilayer films of two or more layers.

Among these, a single-layer film of silver is preferable as the first metal film, and it is even more preferable to use a two-layer structure in which the upper layer is a metal that substantially does not react with silver, or in other words, a metal whose reaction with silver is suppressed, and the lower layer is silver or a silver alloy; a two-layer structure in which the upper layer is a noble metal and the lower layer is silver or a silver alloy; a three-layer structure in which the upper layer is a noble metal, the middle layer is a metal that substantially does not react with silver, and the lower layer is silver or a silver alloy (see FIG. 12b, for example); a four-layer structure in which the upper two layers are noble metals, the middle layer is a metal that substantially does not react with silver, and the lower layer is silver or a silver alloy; or a structure of four or more layers in which the upper layer is a noble metal, the middle two or more layers are a metal that substantially does not react with silver, and the lower layer is silver or a silver alloy.

In particular, when the first metal film is formed from a multilayer film of at least a film comprised of silver or a silver alloy, and a metal film disposed over this silver film or a silver alloy, whose reaction with silver is suppressed, such as when nickel is disposed in contact with silver or a silver alloy, and a noble metal is formed over this, the movement of silver on the side across from the nitride semiconductor layer can be dramatically reduced in the film comprised of silver or a silver alloy, and migration can be further prevented. In addition, this prevents a decrease in the reflection efficiency of the electrode with respect to light produced by the light emitting layer, allowing a semiconductor element with higher light emission efficiency to be obtained. Furthermore, when a layer of titanium, tantalum, or the like is formed between nickel and a noble metal, this prevents the silver touching the nitride semiconductor layer from moving across the nitride semiconductor layer surface, and further enhances the reliability of migration prevention.

Examples of the noble metal referred to here include platinum-series metals, gold, and the like, with platinum and gold being preferable.

Examples of metals that substantially do not react with silver, that is, metals whose reaction with silver is suppressed, include metals that either substantially do not react with silver, or whose reaction with silver is suppressed, at a temperature of 1000° C. or lower, and more specifically, nickel (Ni), ruthenium (Ru), osmium (Os), iridium (Ir), titanium (Ti), vanadium (V), niobium (Nb), tantalum (Ta), cobalt (Co), iron (Fe), chromium (Cr), tungsten (W), and the like. Among these, nickel is preferable.

The phrase "metals that either substantially do not react with silver, or whose reaction with silver is suppressed" refers more specifically to metals that will not mix and form a solid solution with silver, or that will do so only with difficulty, and are included in this as long as the proportion in which they are mixed into silver is less than 5 wt %.

There are no particular restrictions on the thickness of the first metal film, but in the case of a single layer of silver or a silver alloy, for instance, this thickness is one that will allow light to be effectively reflected from the light emitting layer, and more specifically about 200 Å to 1 µm, or about 500 to 3000 Å, and especially about 1000 Å. In the case of a laminar structure, the overall film thickness may be about 500 Å to 5 µm, or about 500 Å to 1 µm, and the silver or silver alloy film included therein can be suitably adjusted within the above range. In the case of a laminar structure, the silver or silver alloy film and the film laminated over it may be patterned in the same step and thereby given the same shape, but it is preferable to cover the lowermost layer of silver or silver alloy film with the film laminated thereover (preferably a metal film that will not react with silver). If this is done, then no matter which electrode material is formed as part of the first metal film over the metal film that will not react with silver, it will not directly react with the silver or silver alloy film, so a reaction with the silver can be prevented.

Also, as discussed above, it is preferable for the first metal film to include the silver or silver alloy film and a nickel film disposed in partial area between said silver film and the nitride semiconductor layer. Having a junction between the nitride semiconductor layer, the nickel, and the silver or silver alloy film increases the adhesion between the nitride semiconductor layer and the first metal film. This nickel may be present as a layer between the silver or silver alloy film and the nitride semiconductor layer, but is preferably formed as islands (see 65a in FIG. 12a). If there is a junction between the nitride semiconductor layer, the nickel, and the silver or silver alloy film, and a junction between the nitride semiconductor layer and the silver or silver alloy film, it will be possible to obtain a light emitting element with high adhesion between the nitride semiconductor layer and the electrode without decreasing the reflection efficiency. The nickel film is preferably present in a thickness of 30 angstroms or less, and especially 10 angstroms or less. In this case, good reflection characteristics can be obtained if the silver or silver alloy film has a thickness of 500 Å or more, and no more than 5 µm.

The adhesion at the junction between the nitride semiconductor layer, the nickel, and the silver or silver alloy film can be further increased by annealing at a temperature of 300° C. or more, and 600° C. or less after the formation of the first metal film or after the formation of the first metal film and the second metal film.

Figure 12A:
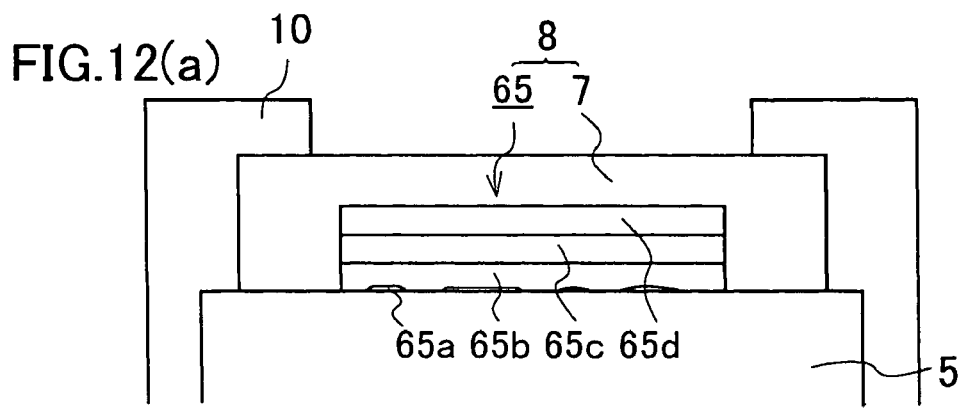
FIGS. 12a to 12d are cross sections of other embodiments of the semiconductor element of the present invention.
Figure 12B:
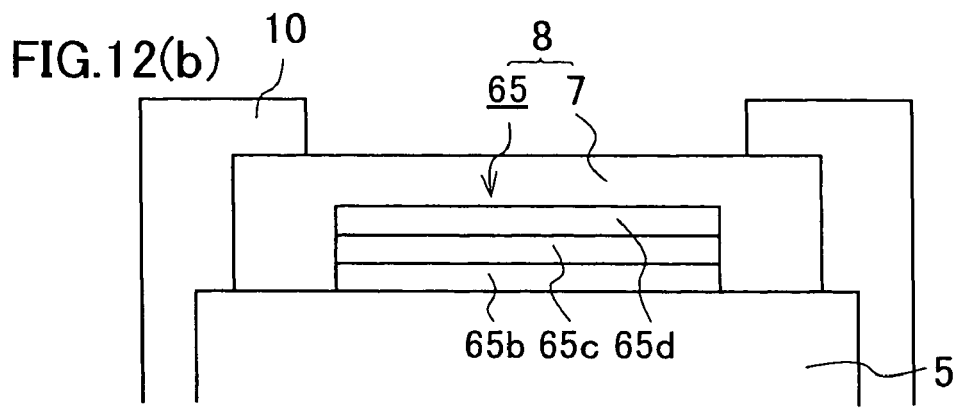
Figure 12C:
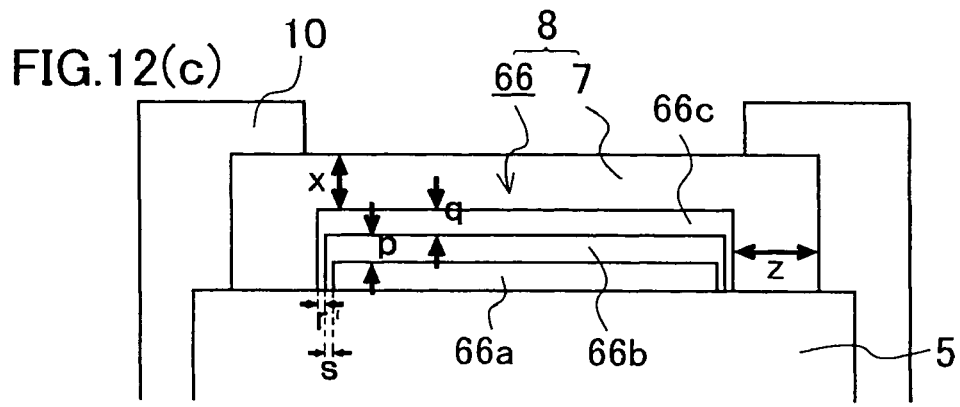
Figure 12D:
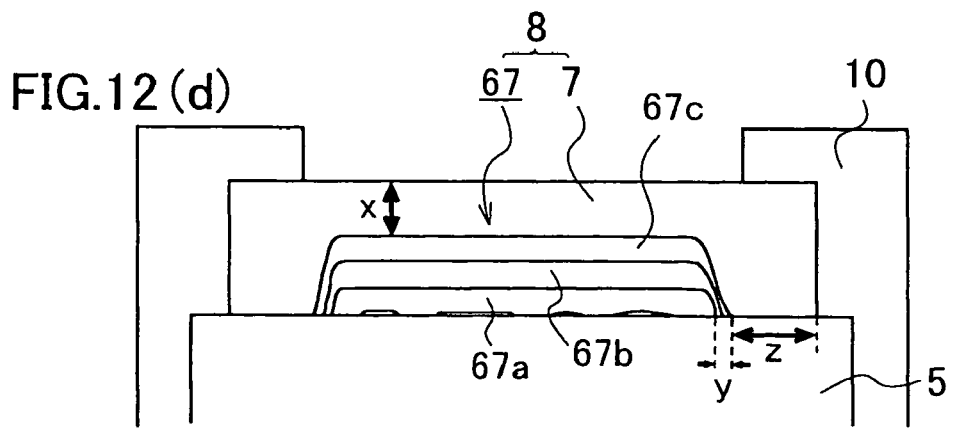

If the first metal film is a multilayer film, the films may all have the same size and shape (see 65a, 65b, and 65c in FIG. 12b), but the silver or silver alloy film of the lower layer is preferably covered by the film laminated thereover, not only on top surface but also on the side surface (FIGS. 12c and 12d). The purpose of the film laminated over the silver or silver alloy film is to prevent migration across the surface of the silver or silver alloy film. Accordingly, this film (or films) is preferably formed such that the thickness of the portion disposed on the side face (the thickness in the direction away from the silver or silver alloy film; the same applies hereinafter) is less than the thickness of the portion disposed over the silver or silver alloy film (p>s and q>r in FIG. 12c).

Also, in this case, the silver or silver alloy film is preferably formed so that it becomes smaller in size moving away from the semiconductor layer surface, that is, so that the sides have a sloped shape (see 67a in FIG. 12d). This is intended to ensure a stable state that strikes a good balance with silver migration on the surface and sides of the film.

Depending on the lamination state of the first metal film, such as when a nickel film is disposed directly over a single-layer film of silver, the first metal film is preferably crystallized (that is, in a crystalline state) at least at the interface with the nitride semiconductor layer. Crystallizing the first metal film ensures better ohmic characteristics with the nitride semiconductor layer, and allows the migration of silver to be prevented more effectively. The crystallization here may be either polycrystallization or monocrystallization, but a preferable state is one in which single crystals are dominant. "Crystallized state" means that the crystal grain boundaries can be recognized by observing a cross section by transmission electron microscopy (TEM), observing by scanning electron microscopy (SEM), measuring the electron diffraction pattern, observing with a super-thin film evaluation apparatus, or another such method. It is preferable here if the crystal grains can be seen to have a diameter (length, height, or width) of from 10 nm to 1 µm, and preferably about 10 nm to 100 nm. For example, when the first metal film is obtained by TEM at the surface of the nitride semiconductor layer, it is preferable if crystal grains of from 10 nm to 1 µm account for at least 50% of the total when the width in cross sectional view is 1.5 µm.

Examples of the method for crystallizing the first metal film at the interface with the nitride semiconductor layer, or the method for forming part of the first metal film in a crystalline state, include forming the first metal film at a specific temperature by vapor deposition, sputtering, ion beam assisted vapor deposition, or another such method, and first forming the first metal film by vapor deposition, sputtering, ion beam assisted vapor deposition, or another such method, and then heat treating this product in the air or in a nitrogen atmosphere, for about 10 to 30 minutes, at a temperature range of about 300 to 600° C.

There are no particular restrictions on the second metal film, but examples include single-layer and multilayer films of zinc (Zn), nickel (Ni), platinum (Pt), palladium (Pd), rhodium (Rh), ruthenium (Ru), osmium (Os), iridium (Ir), titanium (Ti), zirconium (Zr), hafnium (Hf), vanadium (V), niobium (Nb), tantalum (Ta), cobalt (Co), iron (Fe), manganese (Mn), molybdenum (Mo), chromium (Cr), tungsten (W), lanthanum (La), copper (Cu), silver (Ag), yttrium (Y), gold (Au), aluminum (Al), and other such metals and alloys, and ITO, $ZnO_2$, SnO, and other such conductive oxide films.

Favorable examples include a platinum single-layer film, a gold single-layer film, a film with a two-layer structure in which the upper layer is gold and the lower layer is platinum, and a film with a three-layer structure in which the upper layer is platinum, the middle layer is gold, and the lower layer is platinum.

When the first metal film is a single-layer film of silver or a silver alloy, as discussed above, it is preferable for a metal that substantially does not react with silver to be disposed in at least the region of the second metal film that is in contact with the first metal film.

Particularly when the first metal film is formed as a multi-layer film containing no silver or silver alloy in the uppermost layer, the second metal film preferably contains titanium, and a titanium film is preferably disposed at the lowermost layer of the second metal film.

It is also preferable to dispose a conductive material that is commonly used for connecting with other terminals, such as wire bonding over these electrodes, an example of which is disposing gold, platinum, or the like over the top surface (the connection region) of the second metal film. It is even more preferable to dispose a material with good adhesion to the insulating film (discussed below) on the top of the second metal film.

There are no particular restrictions on the thickness of the second metal film, but when a gold bump is formed on this film, for example, the second metal film may be set relatively thick, and when a eutectic (Au—Sn or the like) bump is formed, the second metal film may be set relatively thin. More specifically, the thickness is preferably adjusted as needed so that the total film thickness will be about 100 to 1000 nm.

It is preferable for the second metal film to completely cover the first metal film, that is, to cover substantially all of the top and the entire side surfaces of the first metal film, but a small amount of missing coverage is acceptable, to the extent that no active measures are performed on the second metal film to expose the first metal film. The phase "the second metal film covers the first metal film" may refer to a state in which the second metal film covers the first metal film via another film, or to a state preferably in which the second metal film covers the first metal film by contact or adhering thereto.

In particular, when the first metal film is a multilayer film, the second metal film is preferably thicker than the first metal film other than the silver or silver alloy film on the sides of the first metal film (y<z in FIG. 12d). Also, the second metal film is preferably such that the portions disposed on the sides are thicker than the portion disposed above the first metal film (x<z in FIGS. 12c and 12d). Doing this effectively prevents the movement of silver on the semiconductor surface.

Thus, particularly when the first metal film is comprised of silver or a silver alloy and the second metal film is a metal that substantially does not react with silver (a metal whose reaction with silver is suppressed, such as nickel) at least in the region where it is in contact with the first metal film, there will be no reduction in the amount of silver present near the interface with the nitride semiconductor layer. That is, the silver in the first metal film can be further prevented from being alloyed through diffusion, movement, or the like to the second metal film side as a result of reaction with the second metal film, the light emitted from the light emitting layer can be reflected more efficiently near the surface of the nitride semiconductor layer, and the light emission efficiency can therefore be further improved.

The insulating film need only cover the above-mentioned electrode, but is preferably a nitride film, for example. Typical examples of nitride films include SiN, TiN, $SiO_xN_y$, and other such single-layer films and multilayer films. Of these, a nitride film whose main component is silicon is preferred, and a single-layer film of SiN or the like is particularly favorable. Because the insulating film that covers the electrodes thus involves no film with a relatively high moisture content, such as $SiO_2$, and is instead a film containing nitrogen, in addition to being able to easily form the insulating film with just an ordinary manufacturing process, the nitrogen atoms will trap moisture, so it is possible that moisture can be effectively prevented from penetrating an electrode comprised of silver or a silver alloy, and the migration of silver can be prevented.

The insulating film does not need to cover the electrode completely, and preferably covers everything except the region of the electrode necessary for connection with other terminals. A suitable thickness for the insulating film is about 400 to 1000 nm, for example.

Nevertheless, the insulating film preferably covers the entire surface of the semiconductor layer (such as a p layer) along with the electrode. This prevents silver migration from occurring at the p layer surface.

With the semiconductor element of the present invention, the above-mentioned nitride semiconductor layer may be made up of a nitride semiconductor layer of a first conduction type, a light emitting layer, and a nitride semiconductor layer of a second conduction type, laminated in that order on a substrate, for example. The "first conduction type" here refers to either p-type or n-type, and the "second conduction type" to a conduction type that is different from the first conduction type, that is, either n-type or p-type. Preferably, the semiconductor layer of the first conduction type is an n-type semiconductor layer, and the semiconductor layer of the second conduction type is a p-type semiconductor layer. With this configuration, good ohmic contact is ensured in a p-type nitride semiconductor layer, in which electron diffusion does not readily occur, so current diffusion is increased and the efficiency at which light is reflected from the light emitting layer can be maximized. Therefore, light can be taken off with greater efficiency, and a light emitting element of high quality and high performance can be obtained.

Examples of substrates that can be used include known conductive substrates and insulating substrates, such as sapphire, spinel, SiC, GaN, and GaAs. Of these, a sapphire substrate is preferred.

An insulating substrate may be removed eventually, but need not be removed. If the insulating substrate is removed, the p-electrode and n-electrode may be formed on the same side, or may be formed on different sides. If the insulating substrate is not removed, then the p-electrode and n-electrode are usually both formed on the same side of the nitride semiconductor layer.

The substrate need not be one whose surface is flat, and may be formed with regular or irregular peaks and valleys or the like to the extent that light generated in the light emitting layer can be scattered when reflected.

There are no particular restrictions on the nitride semiconductor layer, but a gallium nitride-based semiconductor compound such as $In_xAl_yGa_{1-x-y}N$ ($0 \leq X$, $0 \leq Y$, $X+Y \leq 1$) can be used favorably. The nitride semiconductor layer may have a single-layer structure, but may also have a laminated structure such as a homo-structure, hetero-structure, or double hetero-structure having an MIS junction, a PIN junction, or a PN junction. It is also possible to use a super-lattice structure, or a single quantum well structure or multiple quantum well structure which produces a quantum effect. The layer may also be doped with either n-type or p-type impurities. This nitride semiconductor layer can be formed by a known process such as metal organic chemical vapor deposition (MOCVD), hydride vapor phase epitaxy (HVPE), molecular beam epitaxy (MBE), sputtering, ion plating, or electron shower. There are no particular restrictions on the thickness of the nitride semiconductor layer, and various thicknesses can be applied as appropriate.

As the laminated structures of the nitride semiconductor layers include described in (1) to (5) below, for example.

(1) A buffer layer composed of GaN of a thickness of 200 Å, an n-type contact layer composed of an Si doped n-type GaN of a thickness of 4 μm, a light emitting layer having a single quantum well structure and composed of undoped $In_{0.2}Ga_{0.8}N$ of a thickness of 30 Å, a p-type clad layer composed of an Mg doped p-type $Al_{0.1}Ga_{0.9}N$ of a thickness of 0.2 μm, and a p-type contact layer composed of an Mg doped p-type GaN of a thickness of 0.5 μm.

(2) A buffer layer composed of AlGaN of a thickness of about 100 Å, an undoped GaN layer of a thickness of 1 μm, an n-side contact layer composed of GaN containing $4.5 \times 10^{18}$/ $cm^3$ of Si of a thickness of 5 μm, an n-side first multi-layer film layer composed of three layers—a bottom layer composed of an undoped GaN of 3000 Å, an intermediate layer composed of GaN containing $4.5 \times 10^{18}$/$cm^3$ of Si of a thickness of 300 Å, and an upper layer composed of undoped GaN of a thickness of 50 Å (an overall thickness of 3350 Å), an n-side second multi-layer film layer having a superlattice structure in which 10 layers each of a 40 Å nitride semiconductor layer composed of undoped GaN and a 20 Å nitride semiconductor layer composed of undoped $In_{0.1}Ga_{0.9}N$ are repeatedly alternately laminated and a 40 Å nitride semiconductor layer composed of undoped GaN is formed thereon (an overall thickness of 640 Å), a light emitting layer having a multiquantum well structure in which six layers each of a 250 Å barrier layer composed of undoped GaN and a 30 Å well layer composed of $In_{0.3}Ga_{0.7}N$ are repeatedly alternately laminated and a 250 Å barrier composed of undoped GaN is formed thereon (an overall thickness of 1930 Å), an p-side multi-layer film layer having a superlattice structure in which 5 layers each of a 40 Å nitride semiconductor layer composed of $Al_{0.15}Ga_{0.85}N$ containing $5 \times 10^{19}$/$cm^3$ of Mg and a 25 Å nitride semiconductor layer composed of $In_{0.03}Ga_{0.97}N$ containing $5 \times 10^{19}$/$cm^3$ of Mg are repeatedly alternately laminated and a 40 Å nitride semiconductor layer composed of $Al0.15Ga_{0.85}N$ containing $5 \times 10^{19}$/$cm^3$ of Mg is formed thereon (an overall thickness of 365 Å), and a p-side contact layer composed of GaN containing $1 \times 10^{20}$/$cm^3$ of Mg of 1200 Å thickness.

(3) A buffer layer composed of AlGaN of a thickness of about 100 Å, an undoped GaN layer of a thickness of 1 μm, an n-side contact layer composed of GaN containing $4.5 \times 10^{18}$/ $cm^3$ of Si of a thickness of 5 μm, an n-side first multi-layer film layer composed of three layers—a bottom layer composed of an undoped GaN of 3000 Å, an intermediate layer composed of GaN containing $4.5 \times 10^{18}$/$cm^3$ of Si of a thickness of 300 Å, and an upper layer composed of undoped GaN of a thickness of 50 Å (an overall thickness of 3350 Å), an n-side second multi-layer film layer having a superlattice structure in which 10 layers each of a 40 Å nitride semiconductor layer composed of undoped GaN and a 20 Å nitride semiconductor layer composed of undoped $In_{0.1}Ga_{0.9}N$ are repeatedly alternately laminated and a 40 Å nitride semiconductor layer composed of undoped GaN is formed thereon (an overall thickness of 640 Å), a light emitting layer having a multiquantum well structure in which a barrier layer composed of undoped GaN of 250 Å thickness is first formed and then 6 layers each of a well layer composed of $In_{0.3}Ga_{0.7}N$ of 30 Å thickness, a first barrier layer composed of $In_{0.02}Ga_{0.98}N$ of 100 Å thickness and a second barrier layer composed of undoped GaN of 150 Å thickness are repeatedly alternately laminated (an overall thickness of 1930 Å) (3-6 layers are preferably repeatedly alternately laminated), an p-side multi-layer film layer having a superlattice structure in which 5 layers each of a 40 Å nitride semiconductor layer composed of $Al_{0.15}Ga_{0.85}N$ containing $5\times10^{19}/cm^3$ of Mg and a 25 Å nitride semiconductor layer composed of $In_{0.03}Ga_{0.97}N$ containing $5\times10^{19}/cm^3$ of Mg are repeatedly alternately laminated and a 40 Å nitride semiconductor layer composed of $Al_{0.15}Ga_{0.85}N$ containing $5\times10^{19}/cm^3$ of Mg is formed thereon (an overall thickness of 365 Å), and a p-side contact layer composed of GaN containing $1\times10^{20}/cm^3$ of Mg of 1200 Å thickness.

Furthermore, by making a bottom layer composed of undoped GaN of 3000 Å arranged on the n-side the bottom layer of a three layer structure composed of a first layer composed of undoped GaN of 1500 Å thickness, a second layer composed of GaN containing $5\times10^{17}/cm^3$ of Si of 100 Å thickness, and a third layer composed of undoped GaN of 1500 Å thickness, it will become possible to control Vf fluctuation that accompanies the elapsed drive time of a light emitting element.

Further, GaN or AlGaN layer of 2000 Å thickness may be provided between the p-side laminated layer and the p-side contact layer. This layer is formed as undopeed layer, but represents p-type conductivity by means of diffusion of Mg from the adjacent layer thereto. Forming this layer improves a withstand electrostatic voltage in the light emitting element. This layer can be omitted for a light emitting device which has electrostatic protective function, but it is preferable to form this layer when the light emitting element do not have electrostatic protective means, such as an electrostatic protective element outside of the light emitting element so that a withstand electrostatic voltage can be improved.

(4) A buffer layer, an undoped GaN layer, an n-side contact layer composed of GaN containing $6.0\times10^{18}/cm^3$ of Si, an undoped GaN layer (an n-type nitride semiconductor layer of an overall thickness of 6 nm), a light emitting layer having a multiquantum well structure in which 5 layers each of a GaN barrier layer containing $2.0\times10^{18}/cm^3$ of Si and a InGaN well layer are repeatedly alternately laminated (overall thickness: 1000 Å), and a p-type nitride semiconductor layer composed of GaN containing $5.0\times10^{18}/cm^3$ of Mg of a thickness of 1300 Å.

Further, InGaN layer may be provided on the p-type nitride semiconductor layer of a 30 to 100 Å thickness, preferably a 50 Å thickness, this layer can be placed in contact with a positive electrode, and will become a p-side contact layer.

(5) A buffer layer, an undoped GaN layer, an n-side contact layer composed of GaN containing $1\times10^{19}/cm^3$ of Si, an undoped GaN layer (an n-type nitride semiconductor layer of an overall thickness of 6 nm), a light emitting layer having a multiquantum well structure in which 7 layers each of a GaN barrier layer containing $3.0\times10^{18}/cm^3$ of Si and an InGaN well layer are repeatedly alternately laminated (overall width: 800 Å), and a p-type nitride semiconductor layer composed of GaN containing $2.5\times10^{20}/cm^3$ of Mg. InGaN layer may be provided on the p-type nitride semiconductor layer of a 30 to 100 Å thickness, preferably a 50 Å thickness.

In plan view, a semiconductor element made up of these semiconductor layers is usually square or approximately square, and the first semiconductor layer has an exposed region in which part of the second semiconductor layer and the light emitting layer are removed as desired in the depth direction of the first semiconductor layer in part of the region of one semiconductor element, so that the surface thereof is exposed. A first electrode is formed on the surface of this exposed first semiconductor layer.

With the semiconductor element of the present invention, a plurality of peaks and valleys are preferably formed in the part of the exposed region where the first electrode is not formed (including the outer edge of the semiconductor element). In other words, as will be discussed below, even though a light emitting layer is present, the plurality of peaks and valleys are preferably formed in the region where holes and electrons are not supplied, so this region does not function as a light emitting layer and does not itself emit light.

The results of thus forming peaks and valleys are believed to be that (1) the light guided through the first semiconductor layer is taken into the convex portions, and taken out from the tops of these convex portions or from the middle portions thereof, (2) the light guided through the first semiconductor layer is scattered at the bases of the convex portions and taken off, and (3) the light coming out sideways from the light emitting layer end face is reflected and scattered by the plurality of convex portions and taken off; that is, light coming out laterally (in the sideways direction of the semiconductor element) can be selectively emitted to the second semiconductor layer side or the substrate side (the vertical direction of the semiconductor element), and as a result, the light take-off efficiency can be increased by about 10 to 20%, for example, and the directionality of the light can be controlled. Particularly with a semiconductor element having a structure in which the light emitting layer is sandwiched by layers of lower refractive index (known as a double hetero-structure), because light is trapped between these layers of lower refractive index, most of the light ends up moving sideways, and providing peaks and valleys is particularly effective with light emitting elements with a structure such as this. Furthermore, providing a plurality of peaks and valleys makes it possible to take off light uniformly over the entire region on the substrate side and the second semiconductor layer side.

These peaks and valleys may be produced by performing a special step for forming convex portions, such as by growing a semiconductor layer on the exposed first semiconductor layer, but the concave and convex portions are preferably formed at the same time, such as in the course of exposing the first semiconductor layer, or in the course of making specific regions into a thin film in order to divide into individual chips. This avoids increasing the number of manufacturing steps. Thus, the peaks and valleys are made up of the same laminar structure as the semiconductor laminar structure of the semiconductor element, that is, of a plurality of layers of different materials, so the difference in the refractive index of the various layers allows the light taken in to the convex portions to be reflected more easily at the layer interfaces, the result of which is believed to be that these peaks and valleys contribute to increased light take-off to the second semiconductor layer side and the substrate side.

The convex portions of these peaks and valleys may be higher than at least the interface between the light emitting layer and the first semiconductor layer adjacent thereto in a semiconductor element cross section, but the tops thereof are preferably located more on the second semiconductor layer side than the light emitting layer, and even more preferably are substantially the same height as the second semiconductor layer. In other words, the convex portions are preferably formed so that their the tops are higher than the light emitting layer. If the convex portions are configured so as to include the second semiconductor layer, the tops thereof will be approximately the same height, so they will not be blocked by the second electrode (discussed below) or the like, and light can be taken off more effectively from the tops of the convex portions to the second semiconductor layer side (and substrate side). If the convex portions are configured so as to be higher than the second semiconductor layer, and preferably higher than the second electrode, light can be taken off even more effectively. The concave portions between the convex portions may be lower than at least the interfaces between the light emitting layer and the second semiconductor layer adjacent thereto, and are preferably formed so as to be lower than the light emitting layer.

There are no particular restrictions on the density of the peaks and valleys, which can be laid out in a number of at least 100, and preferably at least 200, and even more preferably at least 300, and better yet at least 500, per semiconductor element. Doing this further enhances the above-mentioned effects. Viewed from the electrode formation side, the proportion accounted for by the region in which the peaks and valleys are formed can be at least 20 percent, and preferably at least 30 percent, and even more preferably at least 40 percent. There are no particular restrictions on the upper limit, but 80 percent or less is preferred. The surface area of a single convex portion, as measured at its base, can be from 3 to 300 $\mu m^2$, and preferably 6 to 80 $\mu m^2$, and even more preferably 12 to 50 $\mu m^2$.

The vertical cross sectional shape of the convex portions may be square, trapezoidal, semicircular, or the like, but is preferably trapezoidal, in other words, a truncated cone in which the convex portion itself gradually tapers. The angle of inclination of the convex portion in this case can be from 30° to 80°, for example, with 40° to 70° being preferable. In other words, if the convex portions are sloped so that they gradually taper toward their distal ends, all of the light from the light emitting layer is reflected by the convex portion surface, or light that has been guided through the first semiconductor layer is scattered, and as a result, light can be effectively taken off to the second semiconductor layer side (and substrate side). In addition, it is impossible to more easily control directivity of light as well as to take off light more uniformly as a whole.

If the convex portions have a truncated conical shape, then concave portions may further be formed on the top side of the trapezoid (the second semiconductor layer side). The result of this is that the concave portions formed at the tops of the convex portions make it easier for light to be emitted to the second semiconductor layer side (and substrate side) when light that has been guided through the first semiconductor layer penetrates into the convex portions.

Furthermore, the convex portions are preferably disposed at least partially overlapping in groups of two or more, and preferably three or more, in the direction substantially perpendicular to the emission end face of the semiconductor laminated structure. As a result, the light from the light emitting layer acts on the convex portions at a higher probability, so the above-mentioned effects can be obtained more easily.

The semiconductor element of the present invention is usually mounted to a support substrate by flip-chip mounting (face down mounting) to configure a semiconductor light emitting device.

The support substrate is wired on at least the side across from the electrodes of the light emitting element, and protection elements and so forth may be formed as desired, and the flip-chip mounted light emitting elements are fixed and supported on this substrate. The support substrate is preferably made of a material with substantially the same coefficient of thermal expansion as the light emitting elements, such as aluminum nitride for a nitride semiconductor element. This lessens the effect of thermal stress generated between the support substrate and the light emitting elements. The functions of antistatic protection devices and so forth can also be added, and inexpensive silicon may be used. There are no particular restrictions on the wiring pattern, but it is preferable, for example, for a pair of positive and negative wiring patterns to be insulated from each other and formed so that each surrounds the other.

In connecting the support substrate to lead electrodes, wiring may be formed from a conductive member from the side across from the light emitting element to the side across from the lead electrodes.

An n-type substrate of a silicon diode element, for example, can be utilized as a support substrate equipped with the function of a protective element. This n-type silicon substrate is selectively doped with impurity ions to form one or more p-type semiconductor regions, and the opposite direction breakdown voltage is set to a specific voltage level. A p-electrode and an n-electrode are formed over the p-type semiconductor region and the n-type semiconductor region (the n-type silicon substrate itself) of the substrate. Part of each of the p and n-electrodes can consist of a bonding pad. Alternatively, an n-electrode comprised of gold or the like may be formed on the underside of an n-type silicon substrate and used as a bonding pad. Further, an electrode equipped with the function of a reflective film and comprised of a silvery white metal material (such as aluminum or silver) may be formed as a p-electrode and/or n-electrode in a semiconductor region.

When a semiconductor element is mounted on a support substrate, for example, a bump comprised of gold or the like is placed on the support substrate, or the p-electrode and/or n-electrode of the above-mentioned protective device is used as a bump, the p-electrode and n-electrode of the semiconductor element are positioned across from the electrode or the bump formed on the support substrate, and an electrical and mechanical connection is made. This connection can be accomplished, for instance, with a joining member of gold, a eutectic material (Au—Sn, Ag—Sn), solder (Pb—Sn), lead-free solder, or the like, which is subjected to ultrasonic joining and/or heat treatment. When the wiring and the lead electrodes are directly connected, they can be connected, for example, with gold paste, silver paste, or another such joining member. When gold is used as a bump, since a connection is obtained by applying ultrasonic waves and heat, there is the danger that the semiconductor layers in the light emitting element will be damaged. Therefore, it is preferable to form a gold film, a film in which gold is the upper layer and platinum the lower layer, a film in which gold is the upper layer, platinum the middle layer, and rhodium a lower layer, or a film in which gold is the upper layer, platinum a middle layer, rhodium a middle layer, and gold the lower layer, at the uppermost layer as the second metal film of the semiconductor element. When a eutectic material is used as a bump, only heat is applied, so just a gold film may be formed as the second metal film, or a single-layer silver film may be used for the first metal film. When bumps are used, they preferably have a large surface area and are provided in a large number. This improves thermal radiation from the light emitting element and also increases the joining strength to the support substrate of the light emitting element.

When a protective element (such as a diode) is formed on the support substrate, the semiconductor element and the protective device are preferably such that the semiconductor element is connected in parallel with a bi-directional diode consisting of the serial connection of two diodes. This affords a semiconductor device with high reliability, in which the semiconductor element is protected from overvoltage in the forward and reverse directions.

The semiconductor element of the present invention may have an optical conversion member for converting part of the light from the light emitting element into light of a different wavelength. An optical conversion member usually comprises a fluorescent substance that emits fluorescent light when excited by the optical wavelength generated from the light emitting element, and a binder. This makes it possible to provide a light emitting device which converts the light from the light emitting element and which emits white light, incandescent light, and so forth by color mixing the light from the light emitting element with converted light or fluorescent light. The optical conversion member is usually provided on the light take-off side, and is preferably disposed on the opposite side from the substrate side, that is, from the side where the electrode is formed. When a plurality of semiconductor elements are mounted on a single support substrate, this member may be formed in the spaces between light emitting elements.

The optical conversion member can comprise any of various fluorescent substances, such as inorganic fluorescent materials and organic fluorescent materials, that are disposed, or contained in a binder, in and/or around the various constituent members (discussed below), such as a sealing member that covers the light emitting element, a die-bond material that affixes to another support a sub-mount on which a light emitting element has been flip-chip mounted, a resin layer provided around the light emitting element and the support substrate, or support substrates such as sub-mounts and packages.

In particular, a fluorescent substance combined with a sealing member can be provided in sheet form so as to cover the surface of the sealing member on the side where emitted light is observed, and can also be provided inside the sealing member as a filter, cap, sheet, or layer containing a fluorescent material, at a location away from the light emitting element and the surface of the sealing member on the side where emitted light is observed. Also, a wavelength conversion member formed so as to cover a light emitting element that has been flip-chip mounted is preferably formed by screen printing using a screen or a metal mask, using a binder containing a fluorescent substance as the material. Forming in this way makes it easier to form a wavelength conversion member having a uniform thickness around a light emitting element.

Examples of binders include epoxy resins and other such translucent resins, silicone resins with high light resistance, and translucent inorganic materials produced by a sol-gel method using a metal alkoxide as the starting material.

If the light from the light emitting element and the light emitted by the fluorescent material are in a complementary color relationship, white, mixed-color light can be emitted by mixing these lights. More specifically, there are cases when the light from the light emitting element and the light of a fluorescent material that emits light when excited by this light correspond to the three primary colors (red, green, and blue), and there is blue light emitted by the light emitting element, and yellow light from a fluorescent material that emits light when excited by this blue light.

Regarding the color of light emitted by a light emitting device, the color temperature of mixed-color light can be varied by selecting the emission wavelength of the light emitting element and by variously adjusting the proportions in which the various resins that act as binders for the fluorescent materials are used with inorganic members such as glass, the specific gravity of the fluorescent materials, the amount and shape of the fluorescent materials, and so forth. This allows the desired color tone to be provided, such as light in the incandescent region. The light from the light emitting element and the light from the fluorescent material are preferably transmitted efficiently through a molding member to the outside of the light emitting device.

This fluorescent material will settle under its own weight in the vapor or liquid phase, so a layer having a fluorescent material of higher uniformity can be formed by dispersing the fluorescent material in the vapor or liquid phase and allowing it to spread out uniformly, and particularly by letting a suspension stand in the liquid phase. The amount of fluorescent material can be set as desired by repeating this process as many times as necessary.

Two or more types of the fluorescent material formed as above may be contained in a wavelength conversion member composed of a single layer on the surface of the light emitting device, or one or more types may be contained in each layer of a wavelength conversion member made up of two or more layers. This yields white light produced by the color mixing of light from different kinds of fluorescent material. In this case, the various fluorescent materials preferably have similar average particle sizes and shapes in order to reduce color unevenness and to better mix the colors of the light emitted from the various fluorescent substances.

The particle size of the fluorescent material is the value obtained from a volume-based particle size distribution curve, and a volume-based particle size distribution curve is obtained by measuring the particle size distribution of the fluorescent material by laser diffraction and scattering method. More specifically, a fluorescent material is dispersed in an aqueous solution of sodium hexametaphosphate with a concentration of 0.05% at an air temperature of 25° C. and a humidity of 70%, and the particle size is measured within a range of 0.03 to 700 μm with a laser diffraction type of particle size measurement apparatus (SALD-2000A).

The fluorescent material can also be a combination of an aluminum-garnet fluorescent material typified by a YAG fluorescent material, and a fluorescent material capable of emitting red light, and particularly a nitride fluorescent material. The YAG fluorescent material or nitride fluorescent material may be mixed and contained in the wavelength conversion member, or may be separately contained in the wavelength conversion members that make up a plurality of layers.

Aluminum-Garnet Fluorescent Material

An aluminum-garnet fluorescent material is a fluorescent material that contains aluminum, at least one element selected from among Y, Lu, Sc, La, Gd, Tb, Eu, and Sm, and at least one element selected from among Ga and In, and has been activated with at least one element selected from among rare earth elements, and is a fluorescent material that emits light when excited by ultraviolet rays or visible light emitted from an LED chip.

Examples include $YAlO_3:Ce$, $Y_3Al_5O_{12}:Ce$, $Y_4Al_2O_9:Ce$, $(Y_{0.8}Gd_{0.2})_3Al_5O_{12}:Ce$, $Y_3(Al_{0.8}Ga_{0.2})_5O_{12}:Ce$, $Tb_{2.95}Ce0.05Al_5O_{12}$, $Y_{2.90}Ce_{0.05}Tb_{0.05}Al_5O_{12}$, $Y_{2.94}Ce_{0.05}Pr_{0.01}Al_5O_{12}$, and $Y_{2.90}Ce_{0.05}Pr_{0.01}Al_5O_{12}$. Two or more kinds of yttrium-aluminum oxide-based fluorescent material that contain yttrium and are activated by cerium or praseodymium (a yttrium-aluminum-garnet fluorescent material; hereinafter referred to as a YAG fluorescent material) can be used to particular advantage. In particular, when the product is to be used for extended periods at high brightness levels, a material such as $(Re_{1-x}Sm_x)_3(Al_{1-y}Ga_y)_5O_{12}:Ce$ ($0 \leq x < 1$, $0 \leq y \leq 1$, and Re is at least one element selected from the group consisting of Y, Gd, and La) is preferable.

Because an $(Re_{1-x}Sm_x)_3(Al_{1-y}Ga_y)_5O_{12}$:Ce fluorescent material has a garnet structure, it is resistant to heat, light, and moisture, and the peak of its excitation spectrum can be pushed close to 470 nm. Also, the light emission peak is close to 530 nm, and a broad emission spectrum that tails out to 720 nm can be obtained.

The fluorescent material may also comprise a mixture of two or more kinds of luorescent material. Specifically, to use the above-mentioned YAG fluorescent material as an example, the RGB wavelength components can be increased by mixing two or more kinds of $(Re_{1-x}Sm_x)_3(Al_{1-y}Ga_y)_5O_{12}$:Ce fluorescent material with different contents of Al, Ga, Y, La, and Gd or Sm. Also, there is variance in the light emission wavelength of some semiconductor elements at the present time, so two or more kinds of fluorescent material can be mixed and adjusted to obtain the desired white, mixed-color light. More specifically, by adjusting the amounts of fluorescent materials with different chromaticity points according to the light emission wavelength of the light emitting element, it is possible to emit light at the desired points in a chromaticity diagram connected by the light emitting element and these fluorescent materials.

The desired white emitted light color display can be accomplished by a display that mixes blue light emitted from a light emitting element in which a nitride semiconductor layer is used for the light emitting layer, green light emitted from a fluorescent material whose body color is yellow because it absorbs blue light, and red light. For mixed-color light such as this to be emitted, a fluorescent material powder or bulk material can also be contained in any of various resins, such as an epoxy resin, acrylic resin, or silicone resin, or in a translucent inorganic material such as silicon oxide or aluminum oxide. When a fluorescent material is contained in this fashion, it can be used in a variety of ways according to the intended application, such as in layer form, or in a dot pattern formed thin enough that light from the light emitting element can pass through. The desired color tone, such as white or incandescent, can be obtained by adjusting the proportions of fluorescent material and translucent inorganic material, and the coating and filler amounts, and by selecting the light emission wavelength of the light emitting element.

Light can also be efficiently emitted by disposing two or more kinds of fluorescent material in order with respect to the incident light from the light emitting elements. Specifically, a color conversion member having an absorption wavelength on the long wavelength side and containing a fluorescent material that can emit light of a long wavelength, and a color conversion member having an absorption wavelength on a longer wavelength side and containing a fluorescent material that can emit light of a longer wavelength, are laminated over a light emitting element having a reflective member, which allows reflected light to be effectively utilized.

When a YAG fluorescent material is used, a light emitting device having enough light resistance for high efficiency can be obtained even when this fluorescent material is disposed in contact with, or in proximity to, a light emitting element with an irradiance Ee of at least $0.1 \, W \cdot cm^{-2}$ and no more than $1000 \, W \cdot cm^{-2}$.

Because it has a garnet structure, a YAG fluorescent material capable of emitting green light and excited by cerium is resistant to heat, light, and moisture, and the peak wavelength of its excitation spectrum can be pushed from 420 nm to close to 470 nm. Also, the light emission peak wavelength λp is close to 510 nm, and a broad emission spectrum that tails out to close to 700 nm can be obtained. Meanwhile, a YAG fluorescent material that is a yttrium-aluminum oxide-based fluorescent material activated by cerium and that is capable of emitting red light also has a garnet structure, is resistant to heat, light, and moisture, and the peak wavelength of its excitation absorption spectrum can be pushed from 420 nm to close to 470 nm. Also, the light emission peak wavelength λp is close to 600 nm, and a broad emission spectrum that tails out to close to 750 nm can be obtained.

Substituting part of the aluminum with gallium in the composition of a YAG fluorescent material with a garnet structure shifts the light emission spectrum to the short wavelength side, while substituting part of the yttrium in the composition with gadolinium and/or lanthanum shifts the light emission spectrum to the long wavelength side. Varying the composition in this way allows the color of the emitted light to be continuously adjusted. Therefore, the intensity on the long wavelength side can be varied continuously with the compositional ratio of gadolinium, for example, and these are ideal conditions for converting to white emitted light by utilizing the blue light emitted by the nitride semiconductor. If the substitution of yttrium is less than 20%, the green component will be larger and the red component smaller, and if it is over 80%, the red component will be larger, but there will be a sharp decrease in brightness.

Similarly, with the excitation absorption spectrum, substituting part of the aluminum with gallium in the composition of a YAG fluorescent material with a garnet structure shifts the excitation absorption spectrum to the short wavelength side, while substituting part of the yttrium in the composition with gadolinium and/or lanthanum shifts the excitation absorption spectrum to the long wavelength side. The peak wavelength of the excitation absorption spectrum of the YAG fluorescent material is preferably shorter than the peak wavelength of the light emission spectrum of the light emitting element. With a constitution such as this, when the current going to the light emitting element is increased, the peak wavelength of the excitation absorption spectrum will substantially match the peak wavelength of the light emission spectrum of the light emitting element, so a light emitting device with less chromaticity deviation can be formed without lowering the excitation efficiency of the fluorescent material.

An aluminum-garnet fluorescent material can be manufactured by the following method.

First, raw materials are obtained by using oxides, or compounds that will readily become oxides at high temperature, as raw materials of Y, Gd, Ce, La, Al, Sm, Pr, Tb, and Ga, and thoroughly mixing these in stoichiometric ratios. Alternatively, a solution obtained by dissolving the rare earth elements Y, Gd, Ce, La, Sm, Pr, and Tb in stoichiometric ratios in an acid is co-precipitated with oxalic acid, this product is baked to obtain a co-precipitated oxide, and this is mixed with aluminum oxide and gallium oxide to obtain a mixed raw material.

A suitable amount of a fluoride such as ammonium fluoride is mixed into this as a flux, this mixture is put into a crucible and baked for 2 to 5 hours in air at a temperature between 1350 and 1450° C., and this baked product is ground in water in a ball mill, washed, separated, dried, and finally sifted to obtain a fluorescent material.

A fluorescent material can also be manufactured by performing two-stage baking, comprising a first baking step in which a mixture of flux and a mixed raw material obtained by mixing fluorescent raw materials is baked in the air or in a weakly reductive atmosphere, and a second baking step involving baking in a reductive atmosphere. The phrase "weakly reductive atmosphere" as used here means a reductive atmosphere set to be weak so as to include at least the amount of oxygen required in the reaction process of forming the desired fluorescent material from the mixed raw material. Baking in this weakly reductive atmosphere until the formation of the desired fluorescent material structure is complete prevents blackening of the fluorescent material and also prevents a decrease in light absorption efficiency. The "reductive atmosphere" in the second baking step refers to a reductive atmosphere that is stronger than the weakly reductive atmosphere. Thus baking in two stages yields a fluorescent material with higher absorption efficiency at the excitation wavelength.

When a light emitting device is formed using a fluorescent material formed in this way, less fluorescent material is required to obtain the desired color tone, and the light take-off efficiency can be increased.

Two or more kinds of aluminum-garnet fluorescent material activated by cerium and having different compositions may be used as a mixture, or they may be disposed independently. When the fluorescent materials are each disposed independently, it is preferable to dispose them in the order of first the fluorescent material that readily emits light by absorbing light from the light emitting element on the shorter wavelength side, and then the fluorescent material that readily emits light by absorbing light on the longer wavelength side. This affords more efficient light absorption and emission.

Lutetium-Aluminum-Garnet Fluorescent Material

A lutetium-aluminum-garnet fluorescent material is a fluorescent material expressed by the general formula $(Lu_{1-a-b}R_aM_b)_3(Al_{1-c}Ga_c)_5O_{12}$ (where R is at least one kind of rare earth element, with cerium being essential; M is at least one element selected from among Sc, Y, La, and Gd; and $0.0001 \leq a \leq 0.5$, $0 \leq b \leq 0.5$, $0.0001 \leq a+b < 1$, $0 \leq c \leq 0.8$). Examples of the compositional formula include $(Lu_{0.99}Ce_{0.01})_3Al_5O_{12}$, $(Lu_{0.09}Ce_{0.10})_3Al_5O_{12}$, and $(Lu_{0.99}Ce_{0.01})_3(Al_{0.5}Ga_{0.5})_5O_{12}$.

A lutetium-aluminum-garnet fluorescent material (hereinafter referred to as a LAG fluorescent material) can be obtained as follows.

A lutetium compound, a compound of a rare earth element R, a compound of a rare earth element M, an aluminum compound, and a gallium compound are used as the fluorescent raw materials, these compounds are weighed out so as to achieve the proportions of the general formula and mixed, or a flux is added to these fluorescent raw materials and mixed, to obtain a raw material mixture.

This raw material mixture is put into a crucible and then baked in a reductive atmosphere at 1200 to 1600° C., then cooled, after which a dispersion treatment is performed to obtain an fluorescent material expressed by the above general formula.

Oxides or compounds that can be pyrolyzed into oxides, such as carbonates and hydroxides, can be used favorably as the fluorescent raw materials. A co-precipitate including some or all of the metal elements that make up the fluorescent material can also be used as the fluorescent raw material. For example, an aqueous solution of an alkali, carbonate, or the like can be added to an aqueous solution containing these elements to obtain a co-precipitate, and this can be used after being dried or pyrolyzed. A fluoride, borate, or the like is favorable as a flux, and is added in an amount of 0.01 to 1.0 weight parts per 100 weight parts of the fluorescent raw material. The baking atmosphere preferably consists of a mixed gas of hydrogen and nitrogen with a hydrogen concentration of 3.0 vol % or less. The baking temperature is preferably from 1200 to 1600° C., which allows a fluorescent material with the desired median particle size to be obtained. A range of 1300 to 1500° C. is even better.

In the above general formula, R is an activator, which is at least one kind of rare earth element, with cerium being essential. More specifically, these elements include Ce, La, Pr, Nd, Sm, Eu, Gd, Tb, Dy, Ho, Er, Tm, Yb, and Lr. R may be cerium alone, but may also include cerium and at least one element selected from among rare earth elements other than cerium. This is because rare earth elements other than cerium act as co-activators. The cerium here is preferably contained in an amount of at least 70 mol % with respect to the total amount of R. When decreased light emission brightness is taken into account, the a value (R amount) is preferably such that $0.0001 \leq a \leq 0.5$, with $0.001 \leq a \leq 0.4$ being even more preferable, and $0.005 \leq a \leq 0.2$ being better yet. The b value (M amount) is preferably such that $0 \leq b \leq 0.5$, with $0 \leq b \leq 0.4$ being even more preferable, and $0 \leq b \leq 0.3$ being better yet. For example, when M is yttrium, if the b value is over 0.5, there will be an extreme decrease in light emission brightness due to excitation by long wavelength ultraviolet rays to short wavelength visible light, and more particularly 360 to 410 nm excitation. The c value (gallium amount) is preferably such that $0 \leq c \leq 0.8$, and even more preferably $0 \leq c \leq 0.5$, in order to prevent a decrease in light emission brightness as a result of a shift in the light emission wavelength to a shorter wavelength.

The median particle size of the LAG fluorescent material is preferably between 1 and 100 μm, and even more preferably between 5 and 50 μm, with a range of 5 to 15 μm being better yet. If the size is less than 1 μm, the particles of the fluorescent material will tend to form clumps. In contrast, a fluorescent material with a particle size between 5 and 50 μm will have high optical absorbancy and conversion efficiency, and it will be easy to form an optical conversion member. When the product thus contains a fluorescent material of large particle size having excellent optical characteristics, this also makes it easier to mass produce a light emitting device. It is also preferable for a fluorescent material having the above-mentioned median particle size to be contained at a high frequency, with a frequency of 20 to 50% being preferable. Thus using a fluorescent material with less variance in its particle size yields a light emitting device having better color tone and less color unevenness.

A lutetium-aluminum-garnet fluorescent material emits light by being efficiently excited by ultraviolet rays or visible light in the wavelength band of 300 to 550 nm, so it can be effectively utilized as a fluorescent material contained in an optical conversion member. Furthermore, the color of the emitted light can be varied by using a plurality of kinds of LAG fluorescent material of different compositional formulas, or using a LAG fluorescent material along with another type of fluorescent material. With a conventional light emitting device that emits white, mixed-color light by mixing the blue light emitted from a semiconductor element with the light emitted from a fluorescent material that absorbs this blue light and emits yellow light, part of the light from the light emitting element is transmitted and utilized, an advantage to which is that the structure itself can be simplified and it is easier to increase output. On the other hand, because the above-mentioned light emitting device emits light by mixing two colors, its color rendering is inadequate, and improvement is needed in this area. A light emitting device that emits white, mixed-color light by utilizing a LAG fluorescent material affords better color rendering than a conventional light emitting device. Also, a LAG fluorescent material has temperature characteristics that are superior to those of a YAG fluorescent material, so a light emitting device can be obtained with less deterioration and color deviation.

Nitride Fluorescent Material

This fluorescent material contains nitrogen, at least one element selected from among Be, Mg, Ca, Sr, Ba, and Zn, and at least one element selected from among C, Si, Ge, Sn, Ti, Zr, and Hf, and a nitride fluorescent material that is activated by at least one element selected from among rare earth elements can also be utilized. Also, a nitride fluorescent material refers to a fluorescent material that emits light when excited by absorbing visible light or UV rays emitted from an LED chip, or light emitted from a YAG fluorescent material.

There are no particular restrictions, but examples include $Sr_2Si_5N_8$:Eu, Pr, $Ba_2Si_5N_8$:Eu, Pr, $Mg_2Si_5N_8$:Eu, Pr, $Zn_2Si_5N_8$:Eu, Pr, $SrSi_7N_{10}$:Eu, Pr, $BaSi_7N_{10}$:Eu, Ce, $MgSi_7N_{10}$:Eu, Ce, $ZnSi_7N_{10}$:Eu, Ce, $Sr_2Ge_5N_8$:Eu, Ce, $Ba_2Ge_5N_8$:Eu, Pr, $Mg2Ge_5N_8$:Eu, Pr, $Zn_2Ge_5N_8$:Eu, Pr, $SrGe_7N_{10}$:Eu, Ce, $BaGe_7N_{10}$:Eu, Pr, $MgGe_7N_{10}$:Eu, Pr, $ZnGe_7N_{10}$:Eu, Ce, $Sr_{1.8}Ca_{0.2}Si_5N_8$:Eu, Pr, $Ba_{1.8}Ca_{0.2}Si_5N_8$:Eu, Ce, $Mg_{1.8}Ca_{0.2}Si_5N_8$:Eu, Pr, $ZnN_{1.8}Ca_{0.2}Si_5N_8$:Eu, Ce, $Sr_{0.8}Ca_{0.2}Si_7N_{10}$:Eu, La, $Ba_{0.8}Ca_{0.2}Si_7N_{10}$:Eu, La, $Mg_{0.8}Ca_{0.2}Si_7N_{10}$:Eu, Nd, $Zn_{0.8}Ca_{0.2}Si_7N_{10}$:Eu, Nd, $Sr_{0.8}Ca_{0.2}Ge_7N_{10}$:Eu, Tb, $Ba_{0.8}Ca_{0.2}Ge_7N_{10}$:Eu, Tb, $Mg_{0.8}Ca_{0.2}Ge_7N_{10}$:Eu, Pr, $Zn_{0.8}Ca_{0.2}Ge_7N_{10}$:Eu, Pr, $Sr_{0.8}Ca_{0.2}Si_6GeN_{10}$:Eu, Pr, $Ba_{0.8}Ca_{0.2}Si_6GeN_{10}$:Eu, Pr, $Mg_{0.8}Ca_{0.2}Si_6GeN_{10}$:Eu, Y, $Zn_{0.8}Ca_{0.2}Si_6GeN_{10}$:Eu, Y, $Sr_2Si_5N_8$:Pr, $Ba_2Si_5N_8$:Pr, $Sr_2Si_5N_8$:Tb, $BaGe_7N_{10}$:Ce.

One or more elements selected from among Y, La, Ce, Pr, Nd, Gd, Tb, Dy, Ho, Er, and Lu are preferably used as the rare earth element contained in the nitride semiconductor, but Sc, Sm, Tm, or Yb may also be contained. These rare earth elements are mixed into the raw material in elemental form or in the form of an oxide, imide, amide, or the like. Rare earth elements mainly have a stable trivalent electron configuration, but Yb, Sm, and so forth have a bivalent electron configuration, while Ce, Pr, Tb, and so forth have a tetravalent electron configuration. When an oxide of a rare earth element is used, oxygen affects the light emission characteristics of the fluorescent material. That is, any oxygen that is contained may decrease the light emission brightness. On the other hand, advantages include a shorter afterglow.

When manganese is used, the particle size can be increased and higher light emission brightness can be attained. Also, when lanthanum is used as a coactivator, lanthanum oxide ($La_2O_3$) is a white crystal and rapidly changes into a carbonate when left in the air, so it is kept in an inert gas environment. When praseodymium is used as a coactivator, praseodymium oxide ($Pr_6O_{11}$), unlike the typical rare earth oxide of $Z_2O_3$, is a nonstoichiometric oxide obtained as a black powder with the composition of $Pr_6O_{11}$, by heating an oxalate, hydroxide, carbonate, or the like of praseodymium to 800° C. in air. $Pr_6O_{11}$ is used as the starting material in the praseodymium compound synthesis, and $Pr_6O_{11}$ of high purity is commercially available.

In particular, the fluorescent material in the present invention is a silicon nitride based on Sr—Ca—Si—N:Eu, Ca—Si—N:Eu, Sr—Si—N:Eu, Sr—Ca—Si—O—N:Eu, Ca—Si—O—N:Eu, or Sr—Si—O—N:Eu, to which manganese has been added. The basic constituent elements of this fluorescent material are as shown in the general formula $L_XSi_YN_{(2/3X+4/3Y)}$:Eu or $L_XSi_YO_ZN_{(2/3X+4/3Y-2/3Z)}$:EU (L is Sr, Ca, or Sr and Ca). In the general formula, X and Y are preferably such that X=2 and Y=5, or X=1 and Y=7, but the values can be set as desired. More specifically, it is preferable to use a fluorescent material having the basic constituent elements shown in $(Sr_XCa_{1-X})_2Si_5N_8$:Eu, $Sr_2Si_5N_8$:Eu, $Ca_2Si_5N_8$:Eu, $Sr_XCa_{1-X}Si_7N_{10}$:Eu, $SrSi_7N_{10}$:Eu, and $CaSi_7N_{10}$:Eu, to which manganese has been added, but the composition of the fluorescent material may also include one or more elements selected from the group consisting of Mg, Sr, Ca, Ba, Zn, B, Al, Cu, Mn, Cr, and Ni. L is Sr, Ca, or Sr and Ca. The ratio of Sr and Ca can be varied as desired. Using silicon in the composition of the fluorescent material allows a fluorescent material with good crystallinity to be obtained inexpensively.

Europium (Eu), which is a rare earth element, is used for the light emission center. Specifically, with this fluorescent material, $Eu^{2+}$ is used as an activator for the matrix of alkaline earth metal-based silicon nitride. It is preferably used as elemental europium or as europium nitride. This does not apply when manganese is added, though.

The added manganese promotes the diffusion of $Eu^{2+}$ and thereby improves the light emission efficiency, such as light emission brightness, energy efficiency, and quantum efficiency. Manganese is either contained in a raw material, or elemental manganese or a manganese compound is added during the manufacturing process and baked with the raw materials.

At least one element selected from the group consisting of Mg, Ga, In, Li, Na, K, Re, Mo, Fe, Sr, Ca, Ba, Zn, B, Al, Cu, Mn, Cr, O, and Ni is contained in the basic constituent elements or along with the basic constituent elements of the fluorescent material. These elements have effects such as enlarging the particle size and improving the light emission brightness. Also, B, Al, Mg, Cr, and Ni are capable of reducing afterglow.

These nitride fluorescent materials absorb some of the blue light emitted by the light emitting element and emit light in the region from yellow to red. There is provided a light emitting device that emits mixed-color white light with a warm hue by using a nitride fluorescent material along with a YAG fluorescent material, and mixing the light emitted from the light emitting element with the yellow to red light emitted from the nitride fluorescent material. The added fluorescent material other than the nitride fluorescent material preferably contains a yttrium-aluminum oxide fluorescent substance activated with cerium. The reason for this is that the desired chromaticity can be obtained by including the yttrium-aluminum oxide fluorescent substance. The yttrium-aluminum oxide fluorescent substance activated with cerium absorbs some of the light emitted from the light emitting element and emits light in the yellow region.

Here, the light emitted from the light emitting element and the yellow light emitted from the yttrium-aluminum oxide fluorescent substance are mixed so that white, mixed-color light is emitted. Therefore, a light emitting device that emits white, mixed-color light can be provided by mixing the yttrium-aluminum oxide fluorescent substance together with a fluorescent material that emits red light, in a translucent coating member, and combining the light from this mixture with the blue light emitted from the light emitting element. The amount of fluorescent material of the yttrium-aluminum oxide fluorescent substance and the amount of fluorescent material that emits red light can also be suitably varied so as to provide a light emitting device with the desired color temperature. This light emitting device that emits white, mixed-color light affords an improvement in the special color rendering index R9. With a conventional light emitting device that emits white light using only the combination of a blue light emitting element and a yttrium-aluminum oxide fluorescent substance activated with cerium, the special color rendering index R9 is approximately zero in the vicinity of the color temperature Tcp of 4600K, so the red component was lacking. Accordingly, raising the special color rendering index R9 has been a goal that needs to be attained, and in the present invention, the special color rendering index R9 can be raised to approximately 40 in the vicinity of a color temperature Tcp of 4600K, by using a fluorescent material that emits red light together with a yttrium-aluminum oxide fluorescent substance.

Next, the method for manufacturing the fluorescent material (($Sr_xCa_{1-x}$)$_2Si_5N_8$:Eu) will be described, but this is not the only manufacturing method that can be employed. The above-mentioned fluorescent material contains manganese and oxygen.

First, the raw material strontium and calcium are pulverized. It is preferable to use elemental strontium and calcium for the raw materials, but an imide compound, an amide compound, or another such compound can also be used. Also, the raw material strontium and calcium may contain B, Al, Cu, Mg, Mn, MnO, $Mn_2O_3$, $Al_2O_3$, or the like. The raw material strontium and calcium are pulverized in a glove box under an argon atmosphere. The average particle size of the pulverized strontium and calcium is preferably from about 0.1 μm to 15 μm. The purity of the strontium and calcium is preferably at least 2N. To improve mixing, an alloy of one or more of metallic calcium, metallic strontium, and metallic europium can be formed and then nitrided and pulverized, and this product used as the raw material.

The raw material silicon is pulverized. The raw material silicon is preferably in elemental form, but a nitride compound, imide compound, amide compound, or the like can also be used. For example, $Si_3N_4$, $Si(NH_2)_2$, $Mg_2Si$ or the like, can be used. The purity of the raw material silicon is preferably at least 3N, but $Al_2O_3$, magnesium, a metallic borate ($CO_3B$, $Ni_3B$, CrB), manganese oxide, $H_3BO_3$, $B_2O_3$, $Cu_2O$, CuO, or another such compound can also be contained. The silicon is also pulverized in an argon or nitrogen atmosphere in a glove box, just as with the raw material strontium and calcium. The average particle size of the silicon compound is preferably from about 0.1 μm to 15 μm.

Next, the strontium and calcium are nitrided in a nitrogen atmosphere. The strontium and calcium may be mixed and then nitrided, or each may be nitrided individually. This produces nitrides of strontium and calcium. The raw material silicon is nitrided in a nitrogen atmosphere to obtain silicon nitride.

Pulverization is then performed on the nitrides of strontium and calcium, or on the nitride of Sr—Ca. The strontium, calcium, or Sr—Ca nitride is pulverized in a glove box under an argon or nitrogen atmosphere.

Similarly, the nitride of silicon and the europium compound ($Eu_2O_3$) are pulverized. Europium oxide is used as europium compound, but metallic europium, europium nitride, or the like can also be used. An imide compound or amide compound can also be used as the raw material Z. After pulverization, the average particle size of the alkaline earth metal nitride, silicon nitride, and europium oxide is preferably from about 0.1 μm to 15 μm.

The above-mentioned raw materials can contain one or more elements selected from the group consisting of Mg, Sr, Ca, Ba, Zn, B, Al, Cu, Mn, Cr, O, and Ni. Also, the above elements such as Mg, Zn, and B may be mixed, and their content adjusted, in the mixing process described below. These compounds can be added to the raw material individually, but they are usually added in the form of a compound. Compounds of this kind include $H_3BO_3$, $Cu_2O_3$, $MgCl_2$, MgO.CaO, $Al_2O_3$, a metal boride (CrB, $Mg_3B_2$, $AlB_2$, MnB), $B_2O_3$, $Cu_2O$, CuO, and so forth.

After pulverization, the strontium, calcium, or Sr—Ca nitride, the silicon nitride, and the europium compound $Eu_2O_3$ are mixed, and then manganese is added. Because a mixture of these substances is prone to oxidation, the mixing is conducted in a glove box under an argon or a nitrogen atmosphere.

Finally, the mixture of the strontium, calcium, or Sr—Ca nitride, the silicon nitride, and the europium compound $Eu_2O_3$ is baked in a nitrogen atmosphere. This baking yields a fluorescent material expressed by ($Sr_xCa_{1-x}$)$_2Si_5N_8$:Eu and to which manganese has been added. The composition of the targeted fluorescent material can be changed by varying the ratio in which the raw materials are mixed.

A tubular furnace, a compact furnace, a high-frequency furnace, a metal furnace, or the like can be used for baking. The baking can be performed at a temperature between 1200 and 1700° C., but a baking temperature of from 1400 to 1700° C. is preferable. A one-stage baking method is preferable, in which the baking last several hours at between 1200 and 1500° C. while the temperature is gradually elevated, but a two-stage baking method (multistage baking), in which first stage baking is performed between 800 and 1000° C., the temperature is gradually raised, and second stage baking is then performed between 1200 and 1500° C., can also be used. The raw material of the fluorescent material is preferably baked using a crucible or a boat made of boron nitride (BN). In addition to a crucible made of a boron nitride material, an alumina ($Al_2O_3$) crucible can also be used.

A nitride fluorescent material can be used as a fluorescent material capable of emitting reddish light, but the above-mentioned YAG fluorescent material may also be combined with a fluorescent material capable of emitting red light. Such a fluorescent material capable of emitting red light is a fluorescent material that emits light when excited by light having a wavelength of 400 to 600 nm, examples of which include $Y_2O_2S$:Eu, $La_2O_2S$:Eu, CaS:Eu, SrS:Eu, ZnS:Mn, ZnCdS:Ag,Al, and ZnCdS:Cu,Al. Thus, the color rendering of a light emitting device can be improved by using a fluorescent material capable of emitting red light together with a YAG fluorescent material.

The fluorescent materials capable of emitting red light and typified by aluminum-garnet fluorescent materials and nitride fluorescent materials formed as above may be present as two or more types in a wavelength conversion member consisting of a single layer around the light emitting element, or there may be one or more types in a wavelength conversion member consisting of two layers. With a constitution such as this, mixed-color light produced by mixing light from different kinds of fluorescent material can be obtained. In this case, the various fluorescent materials preferably have similar average particle sizes and shapes in order to reduce color unevenness and to better mix the colors of the light emitted from the various fluorescent substances. Also, when it is taken into account that a nitride fluorescent material will end up absorbing part of the light that has undergone wavelength conversion by the YAG fluorescent material, it is preferable to form the wavelength conversion member so that the nitride fluorescent material will be disposed closer to the light emitting element than to the YAG fluorescent material. This constitution prevents part of the light that has undergone wavelength conversion by the YAG fluorescent material from being absorbed by the nitride fluorescent material, and improves the color rendering of the mixed-color light compared to when a mixture of a YAG fluorescent material and a nitride fluorescent material is contained.

Alkaline Earth Metal Silicate

It is also possible to use a fluorescent material that contains an alkaline earth metal silicate activated with europium, as a fluorescent material that absorbs some of the light emitted from the light emitting element and that emits light with a wavelength different from the wavelength of the absorbed light. An alkaline earth metal silicate can be used in a light emitting device in which the excitation light is light in the blue region and which emits mixed-color light of a warm hue. This alkaline earth metal silicate is preferably an alkaline earth metal orthosilicate expressed by the following general formulas:

$$(2-x-y)SrO.x(Ba,Ca)O.(1-a-b-c-d)SiO_2.aP_2O_5bAl_2O_3cB_2O_3dGeO_2:yEu^{2+}$$

(where 0<x<1.6, 0.005<y<0.5, 0<a, b, c, d<0.5), or $$(2-x-y)BaO.x(Sr,Ca)O.(1-a-b-c-d)SiO_2.aP_2O_5bAl_2O_3cB_2O_3dGeO_2:yEu^{2+}$$

(where 0.01<x<1.6, 0.005<y<0.5, 0<a, b, c, d<0.5).

Here, it is preferable for at least one value of a, b, c, and d to be greater than 1.

In addition to the above-mentioned the alkaline earth metal silicate, the fluorescent material composed of an alkaline earth metal salt can be an alkaline earth metal aluminate activated with europium and/or manganese, Y(V,P,Si)O₄:Eu, or an alkaline earth metal-magnesium-disilicate expressed by the following formula:

$$Me(3-x-y)MgSi_2O_3:xEu,yMn$$

(where 0.005<x<0.5, 0.005<y<0.5, and Me is Ba and/or Sr and/or Ca).

Next, the process of manufacturing a fluorescent material composed of an alkaline earth metal silicate will be described.

To manufacture an alkaline earth metal silicate, the starting materials of an alkaline earth metal carbonate, silicon dioxide, and europium oxide are thoroughly mixed in precise stoichiometric quantities according to the selected composition, this mixture is converted into the desired fluorescent material at temperatures of 1100° C. and 1400° C., in a reductive atmosphere, by means of a standard solid state reaction for manufacturing a fluorescent material. Here, it is preferable to add less than 0.2 mol of ammonium chloride or another halide. Also, part of the silicon can be substituted with germanium, boron, aluminum, or phosphorus, and part of the europium can be substituted with manganese, as needed.

High color reproducibility and an emitted light color having the desired color temperature can be obtained, as shown in the table below, by using the fluorescent materials described above, namely, Y(V,P,Si)O₄:Eu, Y₂O₂S:Eu³⁺, or an alkaline earth metal aluminate activated with europium and/or manganese, or a combination of these fluorescent materials.

TABLE 1

| No. | Fluorescent Material | Excitation Wavelength [nm] | Chromaticity x | Chromaticity y | Correlated Color Temp. [K] | Color Rendering Properties Ra |
|---|---|---|---|---|---|---|
| 1-1 | $Sr_{1.4}Ba_{0.6}SiO_4:Eu^{2+}$ | 464 | 0.4619 | 0.4247 | 2778 | 72 |
| 1-2 | $Sr_{1.4}Ba_{0.6}SiO_4:Eu^{2+}$ | 464 | 0.4380 | 0.4004 | 2950 | 73 |
| 1-3 | $Sr_{1.6}Ba_{0.4}SiO_4:Eu^{2+}$ | 464 | 0.4086 | 0.3996 | 3497 | 74 |
| 1-4 | $Sr_{1.9}Ba_{0.08}Ca_{0.02}SiO_4:Eu^{2+}$ | 464 | 0.3762 | 0.3873 | 4183 | 75 |
| 1-5 | $Sr_{1.9}Ba_{0.02}Ca_{0.08}SiO_4:Eu^{2+}$ | 464 | 0.3101 | 0.3306 | 6624 | 76 |
| 1-6 | $Sr_{1.6}Ba_{0.4}SiO_4:Eu^{2+}$ $Sr_{0.4}Ba_{1.6}SiO_4:Eu^{2+}$ | 464 | 0.3135 | 0.3397 | 6385 | 82 |
| 1-7 | $Sr_{1.9}Ba_{0.08}Ca_{0.02}SiO_4:Eu^{2+}$ | 464 | 0.3710 | 0.3696 | 4216 | 82 |
| 1-8 | $Sr_{1.6}Ba_{0.4}SiO_4:Eu^{2+}$ $Sr_{0.4}Ba_{1.6}SiO_4:Eu^{2+}$ $YVO_4:Eu^{3+}$ | 464 | 0.3756 | 0.3816 | 3954 | 84 |
| 1-9 | $Sr_{1.6}Ba_{0.4}SiO_4:Eu^{2+}$ $Sr_{0.4}Ba_{1.6}SiO_4:Eu^{2+}$ Barium magnesium aluminate:$Eu^{2+}$ | 464 | 0.3115 | 0.3390 | 6489 | 66 |
| 1-10 | $Sr_{1.6}Ba_{0.4}(Si_{0.08}B_{0.02})O_4:Eu^{2+}$ $Sr_{0.6}Ba_{1.4}SiO_4:Eu^{2+}$ | 464 | 0.3423 | 0.3485 | 5097 | 82 |
| 1-11 | $Sr_{1.6}Ba_{0.4}(Si_{0.08}B_{0.02})O_4:Eu^{2+}$ $Sr_{0.6}Ba_{1.4}SiO_4$ Strontium magnesium aluminate:$EU^{2+}$ | 464 | 0.3430 | 0.3531 | 5084 | 83 |
| 1-12 | $Sr_{1.4}Ba_{0.6}Si_{0.95}Ge_{0.05}O_4:Eu^{2+}$ | 464 | 0.4134 | 0.3959 | 3369 | 74 |
| 1-13 | $Sr_{1.4}Ba_{0.6}Si_{0.98}P_{0.02}O_{4.01}:Eu^{2+}$ | 466 | 0.4630 | 0.4280 | 2787 | 72 |
| 1-14 | $Sr_{1.4}Ba_{0.6}Si_{0.98}Al_{0.02}O_4:Eu^{2+}$ | 464 | 0.4425 | 0.4050 | 2913 | 73 |

Other Fluorescent Materials

A fluorescent material that emits light when excited by light in the ultraviolet to visible region can also be used as the fluorescent material, specific examples of which are given below.

(1) An alkaline earth halogen apatite fluorescent material activated by either europium or manganese, or by both europium and manganese, such as $M_5(PO_4)_3(Cl,Br):Eu$ (where M is at least one element selected from among Sr, Ca, Ba, and Mg), $Ca_{10}(PO_4)_6ClBr:Mn,Eu$, or another such fluorescent material (2) An alkaline earth aluminate fluorescent material activated by either europium or manganese, or by both europium and manganese, such as $BaMg_2Al_{16}O_{27}:Eu$, $BaMg_2Al_{16}O_{27}:Eu,Mn$, $Sr_4Al_{14}O_{25}:Eu$, $SrAl_2O_4:Eu$, $CaAl_2O_4:Eu$, $GaMgAl_{10}O_{17}:Eu$, $GaMgAl_{10}O_{17}:Eu,Mn$, or another such fluorescent material.

(3) A rare earth acid sulfide fluorescent material activated with europium, such as $La_2O_2S:Eu$, $Y_2O_2S:Eu$, $Gd_2O_2S:Eu$, or another such fluorescent material.

(4) (Zn, Cd)S:Cu, $Zn_2GeO_4$:Mn, $3.5MgO.0.5MgF_2.GeO_2$: Mn, $Mg_6As_2O_{11}$:Mn, (Mg, Ca, Sr,Ba)$Ga_2S_4$:Eu, $Ca_{10}(PO_4)_6$FCl:Sb,Mn (5) An organic complex fluorescent material activated with europium These fluorescent materials may be used singly or in a mixture in a wavelength conversion member consisting of one layer. Further, the fluorescent materials may be used singly or in a mixture in a wavelength conversion member comprising two or more layers.

The semiconductor element of the present invention is preferably sealed with a sealing member. This protects the semiconductor element and so forth from moisture, dust, external force, and so on from an external environment. The shape of the sealing member can be suitably adjusted to control the directional characteristics of the light emitted from the light emitting element, such as providing a lens effect. Examples of the shape of the sealing member include a convex lens shape, a dome shape, a concave lens shape, and so forth, and when seen from the side where light emission is observed, the shape can be elliptical, rectangular, triangular prismatic, or any of various other shapes. The sealing member can be made from an inorganic substance such as glass, or an organic substance such as an epoxy resin, acrylic resin, imide resin, or silicone resin with excellent translucence and light resistance. The sealing member can also contain aluminum oxide, barium oxide, barium titanate, silicon oxide, or the like for the purpose of diffusing the light emitted from the light emitting element. Similarly, any of various colorants can be added in order to provide a filter effect for cutting out unnecessary wavelengths from the light emitting element or external light. Furthermore, a fluorescent substance is contained that emits light when excited by the emission wavelength from the light emitting element. Various filters that relieve internal stress in the sealing resin can also be contained.

The electrode connected to the nitride semiconductor layer may be either a second electrode connected to a semiconductor layer of a second conduction type or a first electrode connected to a semiconductor layer of a first conduction type. Preferably, it is a p-electrode formed in a surface area equal or nearly equal to that of the semiconductor element. This allows the light generated by the light emitting layer to be more efficiently reflected by the above-mentioned electrode containing silver, and allows the reflected light to be utilized more effectively.

However, the electrode connected to the nitride semiconductor layer does not necessarily have to be just one electrode or the other, and the above-mentioned material may be suitably selected for both the p-electrode and the n-electrode, or they may be formed in exactly the same layer structure. Thus forming both electrodes as first metal films of silver or a silver alloy allows light to be reflected even under the region where the n-electrode is formed, that is, over substantially the entire surface of the semiconductor element, and further increases the light take-off efficiency. Also, if a second metal film is formed over the first metal film at the n-electrode, this will prevent a Schottky connection even after a heat treatment has been performed, making it possible to obtain an n-electrode with higher reliability.

The semiconductor element of the present invention will now be described in further detail through reference to the drawings.

WORKING EXAMPLE 1

FIG. 1 illustrates the semiconductor element in this working example.

This semiconductor element 1 was configured as follows; a buffer layer (not shown) composed of $Al_{0.1}Ga_{0.9}N$ and a non-doped GaN layer (not shown) were formed over a sapphire substrate 2. Over this were formed, as an n-type semiconductor layer 3 an n-type contact layer composed of silicon-doped GaN, and a super-lattice n-type clad layer produced by alternately forming a GaN layer (40 Å) and an InGaN layer (20 Å) for 10 iterations. Over this were formed a light emitting layer 4 with a multiple quantum well structure and produced by alternately forming a GaN layer (250 Å) and an InGaN layer (30 Å) for 3 to 6 iterations, and as a p-type semiconductor layer 5, a super-lattice p-type clad layer produced by alternately forming a magnesium-doped $Al_{0.1}Ga_{0.9}N$ layer (40 Å) and a magnesium-doped InGaN layer (20 Å) for 10 iterations, and a p-type contact layer composed of magnesium-doped GaN, layered in that order.

In a region consisting of part of the n-type semiconductor layer 3, the light emitting layer 4 and the p-type semiconductor layer 5 formed over this region were removed, and part of the n-type semiconductor layer 3 itself was removed and exposed in its thickness direction, and an n-electrode 9 was formed over this exposed n-type semiconductor layer 3.

A p-electrode 8 composed of a first metal film 6 composed of silver with a film thickness of 1000 Å and a second metal film 7 composed of platinum with a film thickness of 1000 Å and that covered the first metal film 6 completely was formed over substantially the entire surface of the p-type semiconductor layer 5. An insulating film 10 composed of SiN with a film thickness of 6000 Å was formed from the top and sides of the semiconductor layer where no electrode had been formed, all the way to over part of the p-electrode 8 and the n-electrode 9.

A semiconductor element such as this can be formed by the following manufacturing method.

Formation of Semiconductor Layers

Using an MOVPE reaction apparatus, a wafer was produced by growing on the sapphire substrate 2 (2 inches in diameter), in the following order, a buffer layer composed of $Al_{0.1}Ga_{0.9}N$ in a thickness of 100 Å; a non-doped GaN layer in a thickness of 1.5 μm; as the n-type semiconductor layer 3, an n-type contact layer composed of silicon-doped GaN, in a thickness of 2.165 μm; a super-lattice n-type clad layer produced by alternately forming a GaN layer (40 Å) and an InGaN layer (20 Å) for 10 iterations, in a thickness of 640 Å; a light emitting layer 4 with a multiple quantum well structure and produced by alternately forming a GaN layer (250 Å) and an InGaN layer (30 Å) for 3 to 6 iterations; as the p-type semiconductor layer 5, a super-lattice p-type clad layer produced by alternately forming a magnesium-doped $Al_{0.1}Ga_{0.9}N$ layer (40 Å) and a magnesium-doped InGaN layer (20 Å) for 10 iterations, in a thickness of 0.2 μm; and a p-type contact layer composed of magnesium-doped GaN, in a thickness of 0.5 μm.

Etching

The wafer thus obtained was annealed at 600° C. in a nitrogen atmosphere inside the reaction vessel, thereby further lowering the resistance of the p-type clad layer and the p-type contact layer.

After annealing, the wafer was taken out of the reaction vessel, a mask was formed in a specific pattern on the surface of the p-type contact layer (the uppermost layer), and the wafer was etched from above the mask with an etching apparatus, which exposed part of the n-type contact layer.

Electrode Formation

After the mask was removed, the wafer was placed in a sputtering apparatus, and a silver target was also placed inside the sputtering apparatus. Using argon as the sputtering gas, a silver film was formed in a thickness of 1000 Å over substantially the entire surface of the p-type contact layer of the wafer with this sputtering apparatus.

The silver film thus obtained was patterned in a specific shape using a resist, and over this was formed a platinum film in a thickness of 1000 Å so as to cover the silver film, thereby forming the p-electrode 8.

An n-electrode 9 composed of Rh/Pt/Au was formed in a film thickness of 7000 Å over the exposed n-type contact layer.

Next, a heat treatment was performed with an annealing apparatus at a temperature low enough that the silver and platinum would not mix, and that would have no effect on the element characteristics of the semiconductor layers such as the p-type contact layer.

Formation of Insulating Film

A mask having a specific pattern was formed with a resist over the n-type contact layer and the p-type contact layer including the p-electrode 8 and the n-electrode 9. An SiN film was formed in a thickness of 6000 Å over this, and an insulating film 10 that covered part of the p-electrode 8 and the n-electrode 9 was formed over this by lift-off method.

Formation of Pad Electrode

A mask having a specific pattern was formed with a resist over the insulating film 10, the n-electrode 9, and the p-electrode 8, over which a tungsten layer, a platinum layer, and a gold layer were formed in that order, and a pad electrode (not shown) for bonding purposes was formed by lift-off method in a total film thickness of 1 μm.

The wafer thus obtained was divided into a specific number of pieces to obtain a semiconductor element 1.

The semiconductor element formed as above was connected to power at a temperature of 85° C., a humidity of 85%, and under conditions of If=20 mA, and even after 7000 hours of powered operation, no silver migration was observed in an SEM micrograph of a cross section of the device, nor was any leak current noted.

For the sake of comparison, light emitting elements were formed in the same manner as with the above-mentioned semiconductor element, except that an $SiO_2$ film was formed instead of the SiN film, or no SiN or any other insulating film was formed.

These semiconductor elements were connected to power at a temperature of 85° C., a humidity of 85%, and under conditions of If=20 mA, but leak current occurred intermittently, and the service life of these devices was less than 1000 hours in each case.

Also, an SEM cross section confirmed that silver had been deposited on the n-type contact layer side.

WORKING EXAMPLE 2

The semiconductor element of this working example was constituted the same as the semiconductor element in Working Example 1, except that a multilayer film consisting of an upper layer of platinum, a middle layer of nickel, and a lower layer of silver was formed, in a thickness of 1000 Å, 1000 Å, and 1000 Å, instead of the silver electrode in Working Example 1, and the annealing temperature after the formation of the p-electrode 8 and the n-electrode 9 was raised to about 600° C.

The semiconductor element obtained as above was connected to power under the same conditions as in Working Example 1, but the ohmic properties were still good and no migration had occurred even after 10,000 hours of continuous powered operation, meaning that a semiconductor element of high quality and reliability had been obtained.

Furthermore, the silver electrode was checked before and after power was applied, and crystal grains of about 100 nm were observed in a quantity of about 50% over a range of 1.5 μm near the interface with the p-type contact layer, and the ohmic properties remained good, with no change.

In addition, since the top side of the silver electrode was covered with nickel, which does not react with silver, alloying of the silver and nickel could be avoided, and since the silver was disposed at a high density directly over the nitride semiconductor layer, reflection efficiency was good and the light take-off efficiency was further improved.

WORKING EXAMPLE 3

The semiconductor element of this working example was constituted the same as the semiconductor element in Working Example 1, except that SiON was used instead of the SiN used in Working Example 2.

The performance of the semiconductor element thus obtained varied with the operating environment, but when the humidity was relatively low, for instance, the ohmic properties were just as good as in Working Example 2 in every case, and no migration occurred, meaning that a semiconductor element of high quality and reliability had been obtained.

WORKING EXAMPLE 4

Figure 2A:
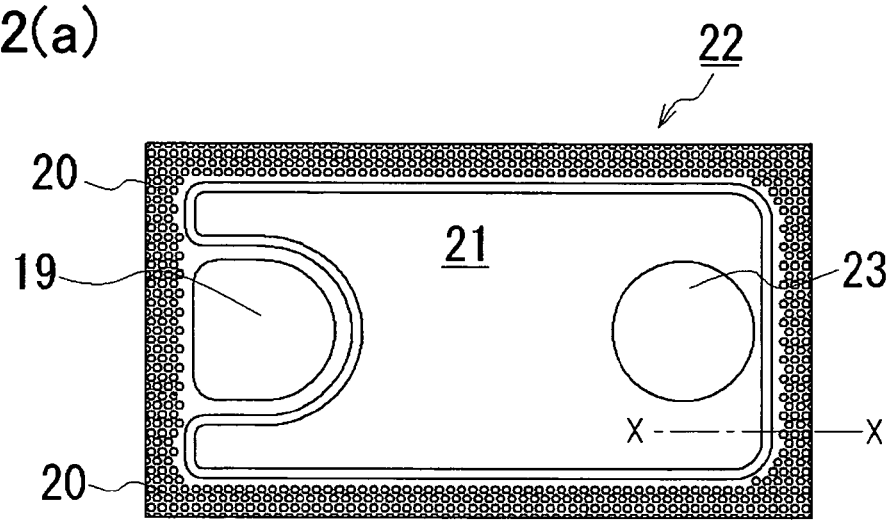
FIG. 2a is a top view, and FIG. 2b a partial cross section, of another embodiment of the semiconductor element of the present invention.
Figure 2B:
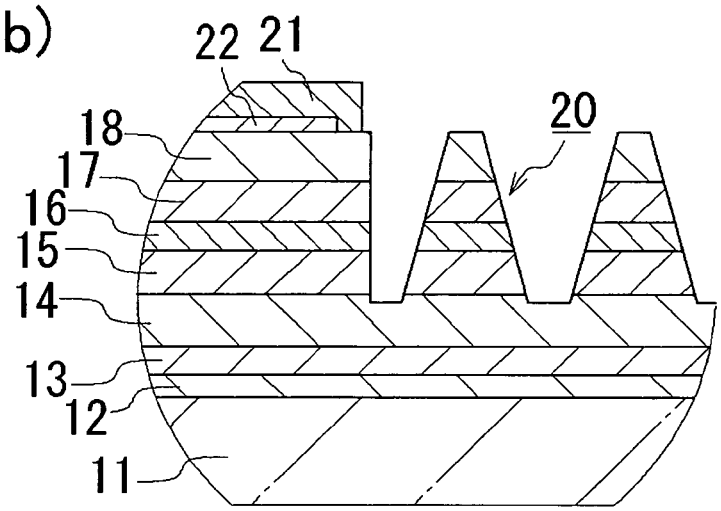

As shown in FIGS. 2a and 2b, the semiconductor element 22 in this working example is the same as in Working Example 1 in that a buffer layer 12, non-doped GaN layer 13, n-type contact layer 14, n-type clad layer 15, active layer 16 with a multiple quantum well structure, p-type clad layer 17, and p-type contact layer 18 are formed in that order, a silver film 22 is formed over substantially the entire surface of the p-type contact layer 18, and a p-electrode is formed over this by forming an upper platinum film and a lower nickel film as a second metal film 21. An n-electrode 19 is formed over the exposed region.

With this semiconductor element 22, a plurality of convex portions 20 in the form of a truncated cone that are of substantially the same height as the active layer 16 and the p-type semiconductor layers are formed around the outer edges of the semiconductor element 22 where the n-electrode 19 is not formed, which is the exposed region in which the p-type semiconductor layers and the active layer 16 has been removed and the n-type contact layer 18 exposes.

The size of these convex portions 20 is about 20 $\mu m^2$ near their base, the total number of these convex portions is about 600, and the convex portions 20 accounts for approximately 20% of the surface area of one light emitting element.

It was found that forming these convex portions increased $\phi_v$ by approximately 10% compared to an element on which no convex portions were formed.

WORKING EXAMPLE 5

Figure 3:
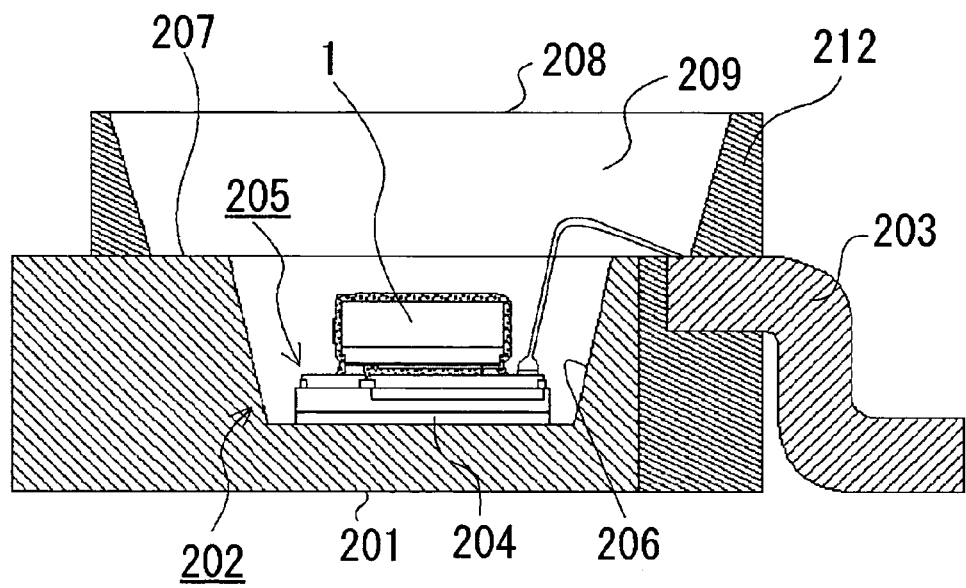
FIG. 3 is a cross section of a light emitting device in which the semiconductor element of the present invention has been mounted.

In this working example, as shown in FIG. 3, a light emitting device was produced by the flip-chip mounting of the semiconductor element 1 from Working Example 1 on a mounting substrate 201.

This light emitting device is constituted such that an LED chip 1 places on a sub-mount substrate 205 via an adhesive layer 204 is mounted in a recess 202 of a package 212 including a mounting substrate 201 to which a lead 203 has been fixed. The sides of the recess 202 functions as a reflection component 206, and the mounting substrate 201 functions as a heat radiation component, and is connected to an external heat radiator (not shown). A terrace 207 is formed on the exterior of the recess 202 of the mounting substrate 201, and this is where a protective device (not shown) is formed. An opening is formed as a light take-off component 208 above the recess 202 of the mounting substrate 201, and a translucent sealing member 209 embedded and sealed in this opening.

This constitution allows light to be reflected more efficiently by the silver film of the p-electrode, and further improves the light take-off efficiency from the substrate side of the semiconductor element.

WORKING EXAMPLE 6

Figure 4:
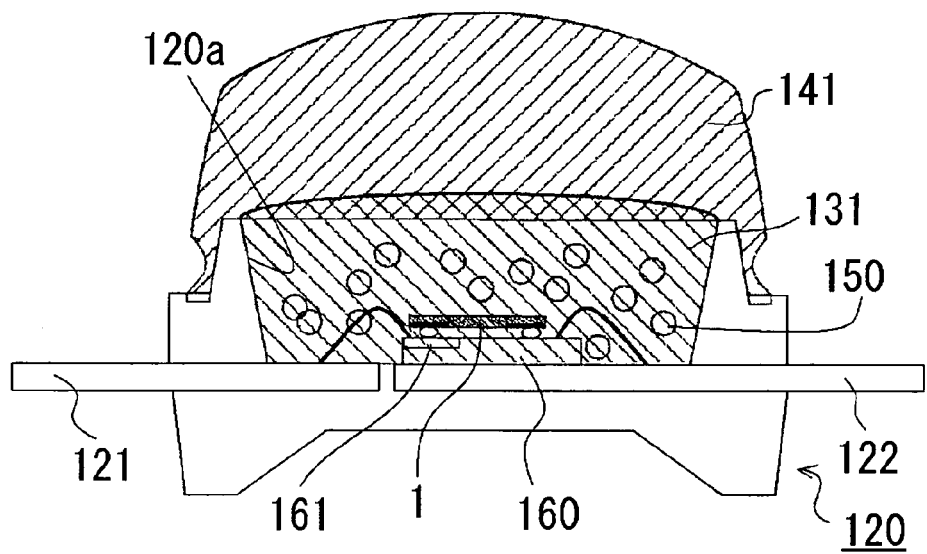
FIG. 4 is a cross section of another light emitting device in which the semiconductor element of the present invention has been mounted.

In this working example, as shown in FIG. 4, a light emitting device was formed by the flip-chip mounting of the semiconductor element 1 of Working Example 1 inside a recess 120a of a stem 120 via a sub-mount member 160.

The stem 120 comprises a first lead 121 and a second lead 122 integrally molded from a resin, and the ends of the first lead 121 and the second lead 122 are partly exposed inside the recess 120a of this stem. The sub-mount member 160 is placed on the exposed second lead 122. An LED chip 200 is placed on this sub-mount member 160 and in the approximate center of the recess 120a. An electrode 161 provided to the sub-mount member 160 is electrically connected to the first lead 121 via a wire, and an electrode 162 is electrically connected to the second lead 122 via a wire.

A sealing member 131 that includes a fluorescent material 150 is embedded in the recess 120a of the stem, and a sealing member 141 covers part of the stem 120 and the sealing member 131.

With this light emitting device, the semiconductor element 1 may mounted directly to the leads without a sub-mount member being interposed, and may be electrically connected by bonding via lead-free solder bumps using an ultrasonic vibration apparatus.

This constitution allows light to be reflected more efficiently by the silver film of the p-electrode, and further improves the light take-off efficiency from the substrate side of the semiconductor element.

WORKING EXAMPLE 7

Figure 5A:
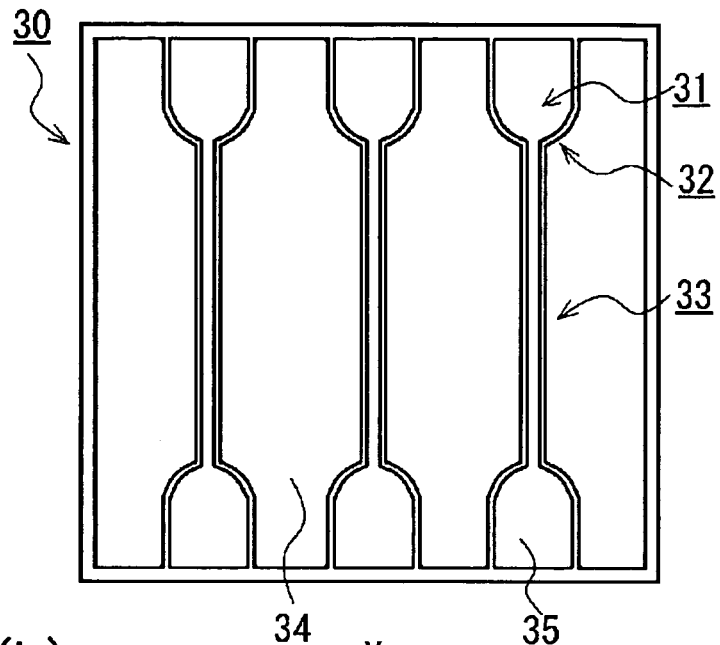
FIG. 5a is a top view of the layout of electrodes in the semiconductor element of the present invention.

The semiconductor element 30 in this working example, as shown in FIG. 5a, is constituted such that the n-type semiconductor layers are exposed in such a way that there are constricted portions 32 that narrow from the end portions 31 where the n pad electrodes are formed, toward the center of the light emitting element, and extended portions 33 that link the pairs of constricted portions 32 facing each other. The p-type semiconductor layers are formed in the regions flanked by the extended portions 33.

Other than the above constitution, the layer structure is substantially the same as that in Working Example 2.

Figure 5B:
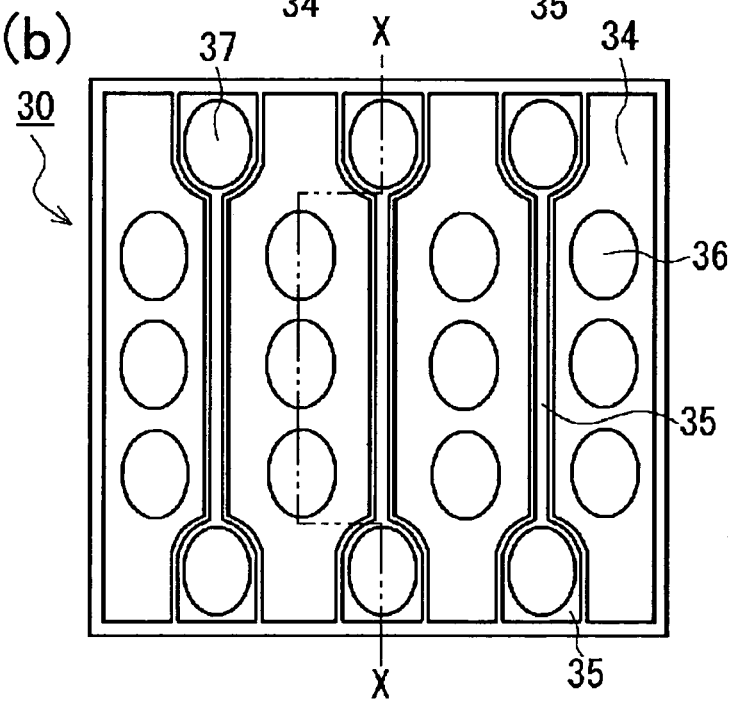
FIG. 5b is a top view of the layout of pad electrodes.

As shown in FIG. 5b, a multilayer film consisting of an upper film of platinum, a middle film of nickel, and a lower film of silver, and, as a second metal film 34, an upper film of platinum and a lower film of gold are formed over the p-type semiconductor layers formed in the regions flanked by the extended portions 33, and n-electrodes 35 are formed from the end portions 31 over the constricted portions 32 and the extended portions 33 and over the n-type semiconductor layers. Pad electrodes 36 and 37 are formed over the second metal film 34 and the n-electrodes 35, respectively. The pad electrodes 36 and 37 can be formed at the same time from the same material, which reduces the number of steps entailed in the manufacture of the electrodes.

Figure 6A:
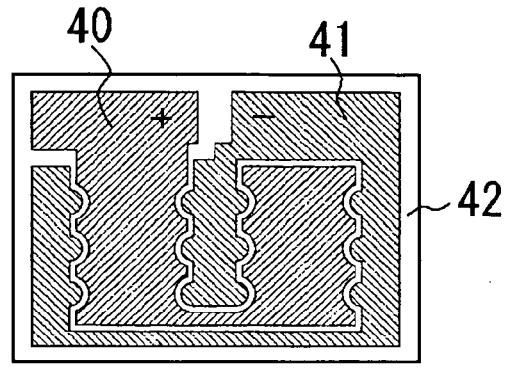
FIG. 6a is a top view of a support substrate for mounting the semiconductor element of the present invention.
Figure 6B:
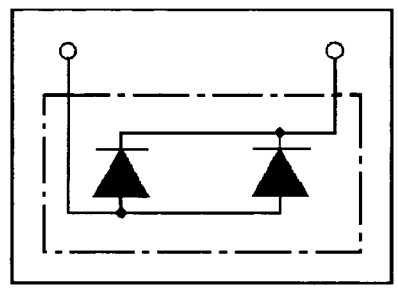
FIG. 6b is a circuit diagram of a light emitting device in which this semiconductor element is mounted.
Figure 6C:
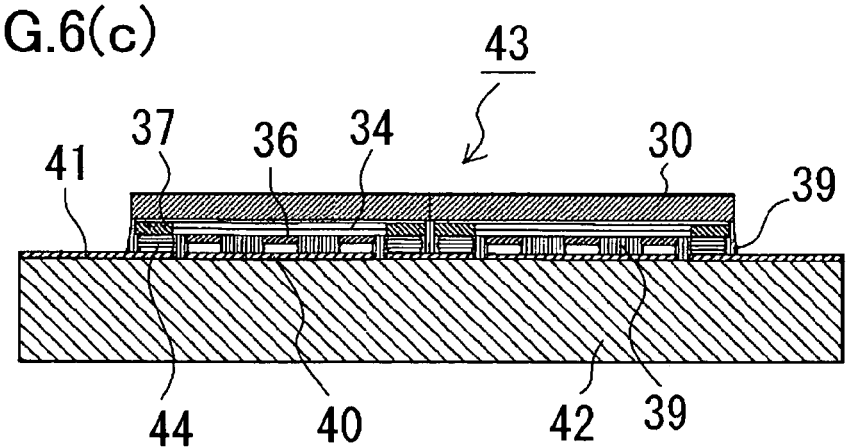
FIG. 6c is a cross section of a light emitting device.

As shown in the X-X cross section in FIG. 5b and in FIGS. 6a and 6b, the semiconductor element 30 constitutes as above is flip-chip bonded by two parallel connections via p and n pad electrodes and bump-electrodes to an aluminum nitride sheet, such as a support substrate 42 on which is formed conductive wiring 40 and 41 composed of gold and formed by plating, for example. This constitutes a light emitting device 43 (FIG. 6c).

The conductive wiring patterns 40 and 41 serve as a pair of positive and negative electrodes, are insulated from each other, and are formed in a comb-like shape so that each partially surrounds the other.

The conductive wiring 40 disposed on the positive (+) pole side of the support substrate 42 extends from the region connected to the positive pole side of an external electrode (not shown), through a position across from the p pad electrode of one light emitting element, and to a position across from the p pad electrode of the other light emitting element. Similarly, the conductive wiring 41 disposed on the negative (−) pole side of the support substrate 42 extends from the region across from one of the n pad electrodes of one of the light emitting elements and of the other of the light emitting elements, through the region connected to the negative pole side of an external electrode (not shown) and the region across from the other n pad electrode of the other light emitting element, and to the region across from the other n pad electrode of the one light emitting element. Viewed from perpendicular to the support substrate 42, the outer edge of the conductive wiring 41 on the negative pole side consists of numerous arcs that are convex in the direction of the conductive wiring 40 on the positive pole side, while the outer edge of the conductive wiring 44 on the positive pole side consists of concave shapes corresponding to the convex outer edge on the negative pole side. The surface area of the region of the light emitting element 30 across from the p pad electrode is greater than the surface area of the region across from the n pad electrode, and there are more p pad electrodes 36 than n pad electrodes 37.

Thus mounting the semiconductor element 30 by two parallel connections to the support substrate 42 affords simpler conductive wiring than with serial connections. Furthermore, this combines with the comb-like shape of the conductive wiring 40 and 41 to further enhance heat radiation from the flip-chip mounted semiconductor element 30.

Also, other than in the region where the semiconductor element 30 and the support substrate 42 are bonded with the bump-electrodes 44, a resin layer 39 made of a silicone resin is disposed in between the semiconductor element 30 and the support substrate 42. Through-holes are provided in the regions where the bump-electrodes 44 are formed for the silicone resin layer 39, and the conductive wiring 40 and 41 is exposed through these holes. The inner walls of the through holes in the resin layer 39 are tapered, and this shape facilitates connection with the bump-electrodes 44.

The bump-electrodes 44 are composed of gold, there are 24 bumps joining the p pad electrode 36 and 12 bumps joining the n pad electrode 37, and bonding is performed by setting the maximum diameter to approximately 105 µm and the maximum height to approximately 40 μm with respect to 1×2 mm size of the light emitting element.

Bonding with bumps involves placing the light emitting element in contact with the top side of the resin layer so that the positive and negative electrodes of the light emitting element are across from each other directly over the bumps, and applying ultrasonic waves while pressing from the substrate side of the light emitting element, thereby joining the conductive wiring and the positive and negative electrodes of the light emitting element via the bumps. Here, because it is flexible and very resilient, the silicone resin contracts under pressure and works its way even into the gaps in the electrode surface of the LED chip. The number of bumps in the through holes is adjusted prior to die bonding so that the joining strength between the conductive wiring and the electrodes of the light emitting element will be sufficiently greater than the resilience of the silicone resin that is squeezed by the die bonding. If this is done, the light emitting element will not be pushed back away from the support substrate by the resilience of the silicone resin, the strength of the joint between the conductive wiring and the electrodes of the light emitting element will be kept constant, and there will be no interruption of current flowing between the conductive wiring and the electrodes of the light emitting element, meaning that a light emitting device of higher reliability can be obtained.

The support substrate is cut and placed on a package so that the desired number of light emitting elements (two in FIG. 6) are included, and these are connected with external electrodes via conductive wires, producing a light emitting device. The shape of the cut support substrates may be rectangular or any other shape.

This constitution allows internal heat to be radiated by wider conductive wiring with a relatively large number of bumps in a light emitting element in which heat tends to build up, improves the heat radiation of the light emitting element, and allows a light emitting device to be obtained which has higher reliability and is capable of emitting brighter light.

Also, the presence of a resin layer substantially eliminates any gaps between the semiconductor element and the support substrate, and prevents the complex optical refraction that is caused by the air contained in such gaps, which increases the light take-off efficiency, and the resin layer also promotes thermal conduction, which enhances the heat radiation effect.

Furthermore, this constitution allows the light from the light emitting element to be reflected more efficiently by the silver film that is the lowermost layer of the p-electrode, and further improves the light take-off efficiency from the sapphire substrate side of a flip-chip mounted light emitting element.

WORKING EXAMPLE 8

As shown in FIG. 12*a*, the semiconductor element in this working example is formed in the same matter as in Working Example 7, except that a nickel film 65*a* whose thickest region is about 5 Å is formed in island form over the p-type semiconductor layers, and over this a multilayer film consisting of an upper platinum film 65*d*, a middle nickel film 65*c*, and a lower silver film 65*b* is formed as a first metal film 65.

The nickel film is formed by sputtering in island form over the p-type semiconductor layers at a growth rate and for a growth time such that the nickel would grow to 5 Å.

As a result, a light take-off efficiency that is substantially the same as in Working Example 7 is obtained, there is less separation at the interface between the p-type semiconductor layers and the multilayer film, and a light emitting element is obtained at a good yield.

WORKING EXAMPLE 9

The semiconductor element in this working example is formed in the same manner as in Working Example 8, except that the upper platinum film, middle nickel film, and lower silver film used in Working Example 8 are changed to an upper platinum film, a middle titanium film, a middle nickel film, and a lower silver film, and titanium is further formed over the middle nickel film in a thickness of 1000 Å.

With this semiconductor element, the migration of silver is suppressed even better than with the element of Working Example 8; for example, migration is suppressed even when light is emitted for an extended period, or when the device is operated under high power conditions, and a light emitting element of high light emission efficiency is obtained.

WORKING EXAMPLE 10

As shown in FIG. 12*c*, the semiconductor element of this working example is formed in the same manner as in Working Example 8, except that the first metal film 66 is a multilayer film consisting of a silver film 66*a*, a laminated film 66*b* of an upper titanium film and a lower nickel film, and a platinum film as.

The opening in the mask used in forming the films is formed so that it gradually widened, so that the thickness of the laminated film 66*b* (upper layer of titanium and lower layer of nickel) and the platinum film 66*c* would be about 500 Å (s and r, respectively, in FIG. 12*c*) on the sides of the silver film. In other words, the thickness of the layers in the surface direction of the silver film (p and q in FIG. 12*c*) is 1000 Å, but the thickness of the films in the side direction is less than 1000 Å. The second metal film 7 is such that the thickness in the surface direction of the first metal film 66 (x in FIG. 12*c*) is 0.5 μm, and the thickness in the side direction (z in FIG. 12*c*) is 5 μm.

With this constitution, migration is suppressed and a light emitting element of high light emission efficiency is obtained even when light is emitted for a longer period, or when the device is operated under higher power conditions, than in Working Example 9.

WORKING EXAMPLE 11

A semiconductor element is obtained in the same manner as in Working Example 9, except that the silver film 67*a* constituting the first metal film 67 is formed by varying the sputtering conditions so that the silver film 67*a* becomes smaller in size (narrower in width in cross sectional view) away from the side in contact with the p-type semiconductor layer 5.

With this semiconductor element, migration is suppressed and a light emitting element of high light emission efficiency is obtained even when light is emitted for a longer period, or when the device is operated under higher power conditions, than in Working Example 10.

WORKING EXAMPLE 12

Figure 7A:
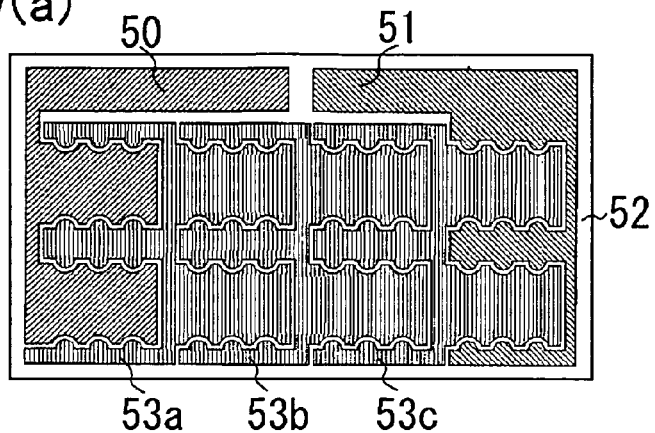
FIG. 7a is a top view of a support substrate for mounting the semiconductor element of the present invention.
Figure 7B:
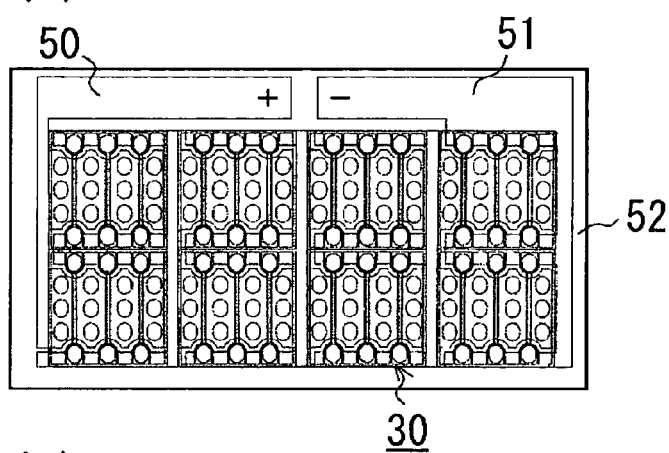
FIG. 7b is a top view of a mounted light emitting element.
Figure 7C:
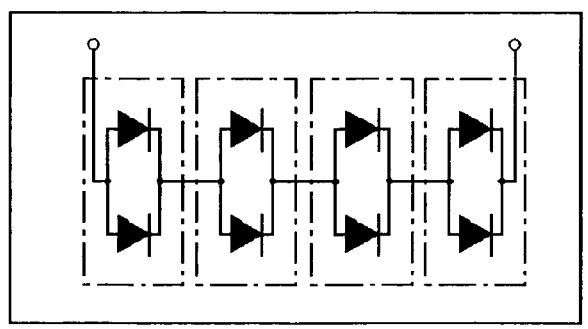
FIG. 7c is a circuit diagram of a light emitting device in which this semiconductor element is mounted.

As shown in FIGS. 7*a* to 7*c*, the light emitting device in this working example is substantially the same as in Working Example 7, except that conductive wiring patterns 50, 51, and 53*a* to 53*c* are formed over a support substrate 52 so that the unit layout of Working Example 7 comprises 4 sets in serial connection, and the light emitting element 30 is die-bonded over this.

In other words, the conductive wiring 50 comprises conductive wiring ("first conductive wiring") 50 on the positive pole side connected to an external positive electrode (not shown) and to the positive electrode of a light emitting element mounted at the end, conductive wiring ("second conductive wiring") 51 on the negative pole side connected to an external negative electrode (not shown) and to the negative electrode of the light emitting element, and third conductive wirings 53a to 53c that electrically connects the positive and negative electrodes of the light emitting element and serially connects the various sets. The conductive wirings 50, 51, and 53a to 53c are laid out in a comb-like (key-like) shape so that the conductive wiring on the positive pole side partially surrounds the conductive wiring on the negative pole side. Therefore, heat radiation is improved even many light emitting elements are mounted, meaning that a light emitting device of higher brightness can be obtained.

WORKING EXAMPLE 13

The light emitting device in this working example is substantially the same as that in Working Example 7, except that a silicone resin containing aluminum oxide is used as a filler, this is squeegeed to a thickness greater than the bump height, and screen printing is performed to form a resin layer.

As a result, a light emitting device is obtained with an even better heat radiation effect and higher light take-off efficiency.

WORKING EXAMPLE 14

Figure 8:
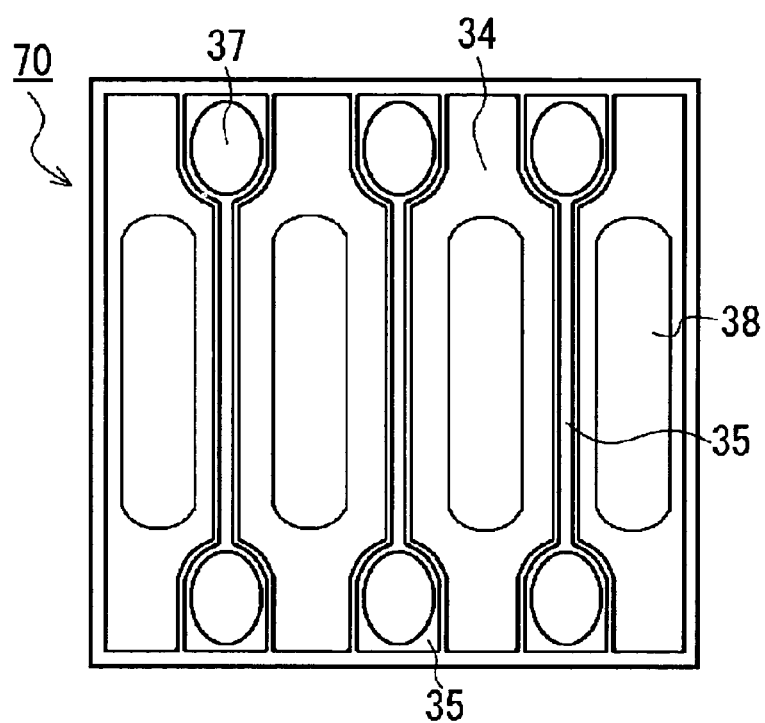
FIG. 8 is a top view of the layout of pad electrodes in another semiconductor element of the present invention.

As shown in FIG. 8, the semiconductor element 70 in this working example is substantially the same as the semiconductor element 30 in Working Example 7, except that the p pad electrodes are formed in an elliptical shape.

As shown in FIGS. 9a and 9b, these semiconductor elements 70 are flip-chip mounted in a 2×2 matrix on a hexagonal support substrate 62 on whose surface conductive wirings 60 and 61 have been formed.

The light emitting device constituted as above has the same effect as that in Working Example 7.

WORKING EXAMPLE 15

Figure 10:
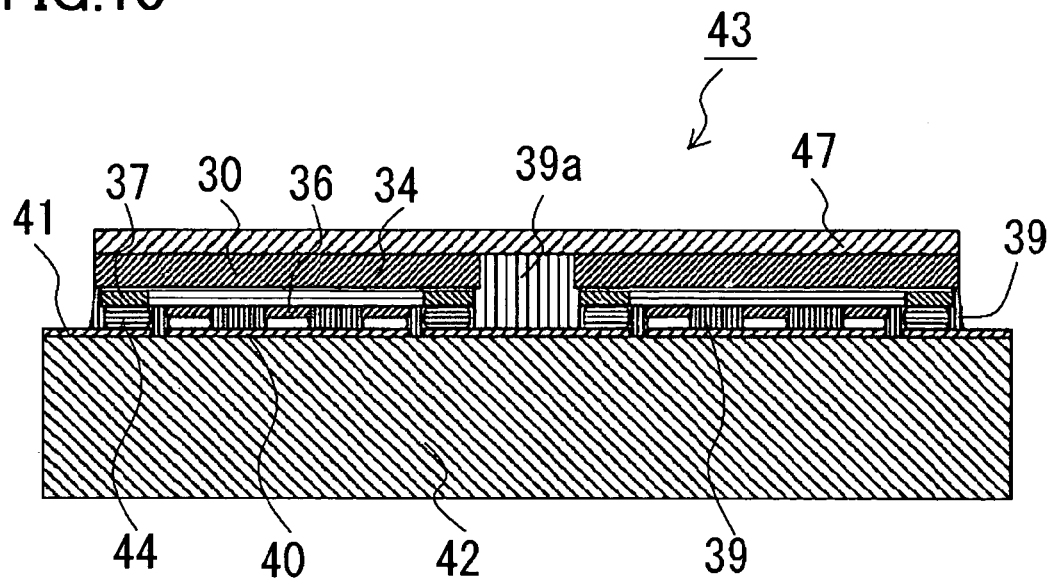
FIG. 10 is a cross section of a light emitting device in which the semiconductor element of the present invention has been mounted.

As shown in FIG. 10, the light emitting device 45 in this working example is substantially the same as the light emitting device in Working Example 7, except that a translucent resin layer 39a is embedded in the gaps between the flip-chip mounted semiconductor elements 30, and a wavelength conversion member 47 containing a fluorescent material that absorbs at least part of the light from the semiconductor elements 30 and emits light of a different wavelength is formed flush with the top side of the resin layer 39a and the light-emitting sides of the semiconductor elements 30.

The fluorescent material may be contained not only in the wavelength conversion member 47, but also in both of the resin layers 39 and 39a, or may be contained only in one or both of the resin layers 39 and 39a.

When the resin layer 39a thus covers at least the sides of the light emitting elements, the wavelength conversion member 47 is prevented from coming in from the sides of the light emitting elements 30 in the formation step thereof.

WORKING EXAMPLE 16

Figure 11:
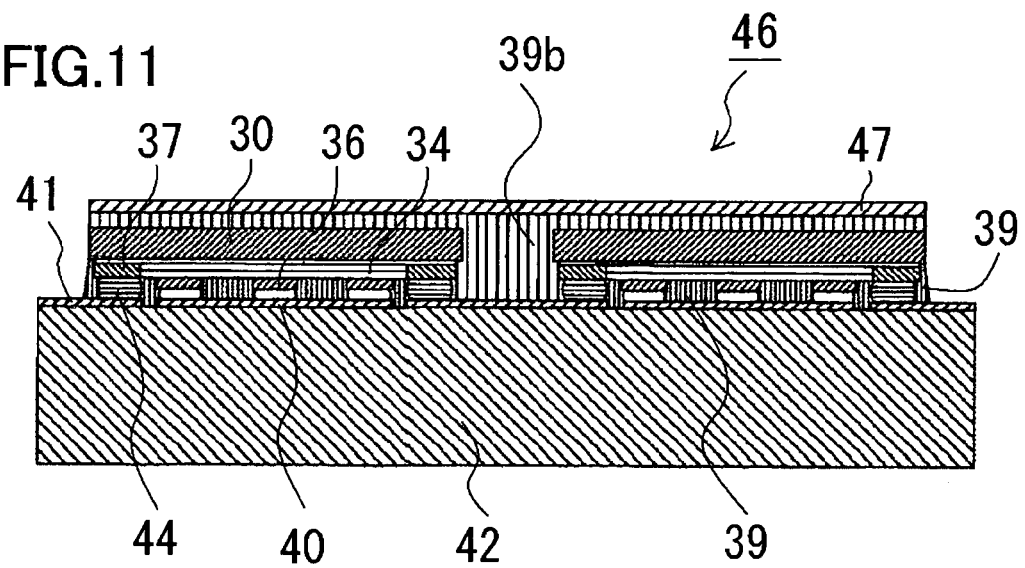
FIG. 11 is a cross section of another light emitting device in which the semiconductor element of the present invention has been mounted.

As shown in FIG. 11, the light emitting device 46 in this working example is substantially the same as the light emitting device in Working Example 11, except that a translucent resin layer 39b is formed in a uniform thickness from the gaps between the flip-chip mounted semiconductor elements 30 all the way to the substrate of the semiconductor elements 30, and the wavelength conversion member 47 is formed flush with the top side of the resin layer 39b.

The fluorescent material may be contained not only in the wavelength conversion member 47, but also in both of the resin layers 39 and 39b, or may be contained only in one or both of the resin layers 39 and 39b.

This results in a light emitting device with superior optical characteristics and uniform chromaticity depending on the direction in which the emitted light is observed. Also, separating the semiconductor elements from the fluorescent material by a resin layer suppresses deterioration of the fluorescent material by heat and the attendant decrease in light emission brightness, meaning that a light emitting device with higher light emission efficiency can be obtained.

INDUSTRIAL APPLICABILITY

The semiconductor element of the present invention can be used to advantage for semiconductor light emitting elements that constitute various kinds of light source, such as backlight light sources, displays, illumination, automotive lamps, and so forth, and in semiconductor light receiving elements and other semiconductor devices.

The invention claimed is:

1. A semiconductor element, comprising a nitride semiconductor layer, an electrode connected to said nitride semiconductor layer, and an insulating film covering at least part of said electrode,
   wherein the electrode comprises:
   a first metal film in contact with the nitride semiconductor layer; and
   a second metal film completely covering the first metal film,
   wherein the first metal film is a multilayer film comprising a silver or a silver alloy film, and further comprising one or more metal films that inhibit a reaction with silver and are disposed over the silver or silver alloy film, and
   the insulating film comprises a nitride film,
   wherein at least one of the one or more films disposed over the silver or silver alloy film in the first metal film is formed such that the thickness of a portion disposed on a side face of the silver or silver alloy film is less than the thickness of the portion disposed over the silver or silver alloy film, and
   wherein the second metal film is formed such that the portions disposed on sides of the first metal film are thicker than the portion disposed above said first metal film.

2. A semiconductor element, comprising a nitride semiconductor layer, an electrode connected to said nitride semiconductor layer, and an insulating film covering at least part of said electrode,
   wherein the electrode comprises:
   a first metal film including silver or a silver alloy and in contact with the nitride semiconductor layer; and
   a second metal film formed so as to prevent the silver from moving across the surface of the nitride semiconductor layer, and
   the insulating film comprises a nitride film,
   wherein a metal film disposed over the silver or silver alloy film in the first metal film is formed such that the thickness of a portion disposed on a side face of the silver or silver ahoy film is less than the thickness of the portion disposed over the silver or silver alloy film, and wherein the second metal film is formed such that the portions disposed on sides of the, first metal film are thicker than the portion disposed above said first metal film.

3. The semiconductor element according to claim 1, wherein the nitride film is formed from either silicon nitride or silicon oxynitride.

4. The semiconductor element according to claim 1, wherein the first metal film is a single crystal at least at the interface with the nitride semiconductor layer.

5. The semiconductor element according to claim 1, wherein the first metal film comprises, in addition to a silver or a silver alloy film, a nickel film disposed in a partial area between said silver or silver alloy film and the nitride semiconductor layer.

6. The semiconductor element according to claim 1, wherein the second metal film comprises a metal that inhibits a reaction with silver, at least in the region in contact with the first metal film.

7. The semiconductor element according to claim 1, wherein the second metal film comprises a metal selected from the group consisting of nickel (Ni), ruthenium (Ru), osmium (Os), iridium (Ir), titanium (Ti), vanadium (V), niobium (Nb), tantalum (Ta), cobalt (Co), iron (Fe), chromium (Cr), and tungsten (W) and disposed at least in the region in contact with the first metal film.

8. The semiconductor element according to claim 6, wherein at least the region of the second metal film that is in contact with the first metal film is formed from nickel.

9. The semiconductor element according to claim 1, wherein the nitride semiconductor layer comprises a nitride semiconductor layer of a first conduction type, a light emitting layer, and a nitride semiconductor layer of a second conduction type that is different from that of the nitride semiconductor layer of the first conduction type, in that order, and a second electrode, connected to the nitride semiconductor layer of the second conduction type.

10. The semiconductor element according to claim 9, wherein the nitride semiconductor layer of the first conduction type is an n-type semiconductor layer, and the nitride semiconductor layer of the second conduction type is a p-type semiconductor layer.

11. The semiconductor element according to claim 2, wherein the nitride film is formed from either silicon nitride or silicon oxynitride.

12. The semiconductor element according to claim 2, wherein the first metal film is a single crystal at least at the interface with the nitride semiconductor layer.

13. The semiconductor element according to claim 2, wherein the first metal film comprises, in addition to a silver or a silver alloy film, a nickel film disposed in a partial area between the silver or silver alloy film and the nitride semiconductor layer.

14. The semiconductor element according to claim 2, wherein the second metal film comprises a metal that inhibits a reaction with silver at least in the region in contact with the first metal film.

15. The semiconductor element according to claim 2, wherein the second metal film comprises a metal selected from the group consisting of nickel (Ni), ruthenium (Ru), osmium (Os), iridium (Ir), titanium (Ti), vanadium (V), niobium (Nb), tantalum (Ta), cobalt (Go), iron (Fe), chromium (Cr), and tungsten (W) and disposed at least in the region in contact with the first metal film.

16. The semiconductor element according to claim 14, wherein at least the region of the second metal film that is in contact with the first metal film is formed from nickel.

17. The semiconductor element according to claim 2, wherein the nitride semiconductor layer comprises a nitride semiconductor layer of a first conduction type, a light emitting layer, and a nitride semiconductor layer of a second conduction type that is different from that of the nitride semiconductor layer of the first conduction type, in that order, and a second electrode connected to the nitride semiconductor layer of the second conduction type.

18. The semiconductor element according to claim 17, wherein the nitride semiconductor layer of the first conduction type is an n-type semiconductor layer, and the nitride semiconductor layer of the second conduction type is a p-type semiconductor layer.

19. The semiconductor element according to claim 1, wherein a nickel film is disposed in a partial area between the silver or silver alloy film in the first metal film and the nitride semiconductor layer.

20. The semiconductor element according to claim 1, wherein the thickness of the second metal film is greater than the thickness of the side portions of the first metal film.

21. The semiconductor element of claim 2, wherein a nickel film is disposed in a partial area between the silver or silver alloy film in the first metal film and the nitride semiconductor layer.

22. The semiconductor element according to claim 2, wherein the thickness of the second metal film is greater than the thickness of the side portions of the first metal film.

23. The semiconductor element according to claim 1, wherein the silver or silver alloy film in the first metal film is formed so that it becomes smaller in size away from a side in contact with the nitride semiconductor layer in contact with the first metal film.

24. The semiconductor element according to claim 2, wherein the silver or silver alloy film in the first metal film is formed so that it becomes smaller in size away from a side in contact with the nitride semiconductor layer in contact with the first metal film.

* * * * *